(12) United States Patent
Takehara

(10) Patent No.: US 8,619,930 B2
(45) Date of Patent: Dec. 31, 2013

(54) SYNCHRONIZATION CIRCUIT AND SYNCHRONIZATION METHOD

(75) Inventor: Masaru Takehara, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/427,209

(22) Filed: Mar. 22, 2012

(65) Prior Publication Data

US 2012/0300882 A1    Nov. 29, 2012

(30) Foreign Application Priority Data

May 24, 2011    (JP) .................................. 2011-116143

(51) Int. Cl.
*H04L 7/00*    (2006.01)
*H03K 3/00*    (2006.01)

(52) U.S. Cl.
USPC .......................................... 375/354; 327/227

(58) Field of Classification Search
USPC ......... 375/354, 355, 371, 357, 316, 324–332;
327/141, 144, 166, 176, 185, 227, 100,
327/198; 326/93, 94, 9, 12
See application file for complete search history.

(56) References Cited

U.S. PATENT DOCUMENTS

| 4,933,571 A | * | 6/1990 | Pribyl | ............................ | 327/210 |
| 5,455,840 A | * | 10/1995 | Nakauchi et al. | ............. | 375/371 |
| 5,657,318 A | | 8/1997 | Ohmori et al. | | |
| 5,909,473 A | * | 6/1999 | Aoki et al. | ...................... | 375/373 |
| 6,373,911 B1 | * | 4/2002 | Tajima et al. | .................. | 375/375 |

FOREIGN PATENT DOCUMENTS

| JP | 2-90744 | 3/1990 |
| JP | 8-125643 | 5/1996 |

* cited by examiner

*Primary Examiner* — Sam K Ahn
*Assistant Examiner* — Vineeta Panwalkar
(74) *Attorney, Agent, or Firm* — Staas & Halsey LLP

(57) ABSTRACT

A synchronization circuit that synchronizes received data, includes: a determiner for determining whether or not data with a phase of a internal clock can be stably captured by the synchronization circuit, when the synchronization circuit accepts the data received from another device connected to the synchronization circuit with the phase of the internal clock of the synchronization circuit; a first flip-flop circuit accepting the data and the internal clock, capturing the data with the phase of the internal clock and synchronizing the data, when the determiner determines that the synchronization circuit can stably capture the data; a second flip-flop accepting the data and an inverted internal clock that has a phase obtained by inverting the phase of the internal clock, capturing the data with the phase of the inverted internal clock, and synchronizing the data, when the determiner determines that the synchronization circuit can not stably capture the data.

7 Claims, 26 Drawing Sheets

FIG. 12

|  | a | b | c | d | e | f |
|---|---|---|---|---|---|---|
| FF OUTPUT OF SHIFT REGISTER 17 | 0 | 1 | 0 | 1 | 0 | 1 |
| FF OUTPUT OF SHIFT REGISTER 18 | 1 | 1 | 1 | 0 | 1 | 1 |
| FF OUTPUT OF SHIFT REGISTER 19 | 1 | 0 | 1 | 0 | 1 | 0 |
| FF OUTPUT OF SHIFT REGISTER 20 | 1 | 0 | 1 | 0 | 1 | 0 |

| TERM | ay | by | cy | dy | ey | fy | ADOPTED EDGE | |
|---|---|---|---|---|---|---|---|---|
| | | | | | | | y=2 or 3 | y=1 or 4 |
| 1 | 0 | 0 | x | x | x | x | 0 DEGREES | 180 DEGREES |
| 2 | 1 | 1 | x | x | x | x | 0 DEGREES | 180 DEGREES |
| 3 | 0 | 1 | 1 | x | x | x | 0 DEGREES | 180 DEGREES |
| 4 | 1 | 0 | 0 | x | x | x | 0 DEGREES | 180 DEGREES |
| 5 | 0 | 1 | 0 | 0 | x | x | 0 DEGREES | 180 DEGREES |
| 6 | 1 | 0 | 1 | 1 | 1 | x | 0 DEGREES | 180 DEGREES |
| 7 | 0 | 1 | 0 | 0 | 1 | x | 0 DEGREES | 180 DEGREES |
| 8 | 1 | 0 | 1 | 1 | 0 | x | 0 DEGREES | 180 DEGREES |
| 9 | 0 | 1 | 0 | 1 | 0 | 0 | 0 DEGREES | 180 DEGREES |
| 10 | 1 | 0 | 1 | 0 | 1 | 1 | 0 DEGREES | 180 DEGREES |

FIG. 19

| TERM | a1 | a2 | a3 | a4 | ADOPTED EDGE |
|---|---|---|---|---|---|
| 1 | 0 | 0 | 0 | 0 | 180 DEGREES |
| 2 | 0 | 0 | 0 | 1 | 0 DEGREES |
| 3 | 0 | 0 | 1 | 1 | 0 DEGREES |
| 4 | 0 | 1 | 1 | 1 | 180 DEGREES |
| 5 | 1 | 1 | 1 | 1 | 180 DEGREES |
| 6 | 1 | 1 | 1 | 0 | 0 DEGREES |
| 7 | 1 | 1 | 0 | 0 | 0 DEGREES |
| 8 | 1 | 0 | 0 | 0 | 180 DEGREES |

(1) — row 2
(2) — row 3
(3) — row 4

FIG. 23

| TERM | ay | by | cy | dy | ey | fy | ADOPTED EDGE y=3 or 4 or 5 or 6 | y=1 or 2 or 7 or 8 |
|---|---|---|---|---|---|---|---|---|
| 1 | 0 | 0 | X | X | X | X | 0 DEGREES | 180 DEGREES |
| 2 | 1 | 1 | X | X | X | X | 0 DEGREES | 180 DEGREES |
| 3 | 0 | 1 | 1 | X | X | X | 0 DEGREES | 180 DEGREES |
| 4 | 1 | 0 | 0 | X | X | X | 0 DEGREES | 180 DEGREES |
| 5 | 0 | 1 | 0 | 0 | X | X | 0 DEGREES | 180 DEGREES |
| 6 | 1 | 0 | 1 | 1 | X | X | 0 DEGREES | 180 DEGREES |
| 7 | 0 | 1 | 0 | 1 | 1 | X | 0 DEGREES | 180 DEGREES |
| 8 | 1 | 0 | 1 | 0 | 0 | X | 0 DEGREES | 180 DEGREES |
| 9 | 0 | 1 | 0 | 1 | 0 | 0 | 0 DEGREES | 180 DEGREES |
| 10 | 1 | 0 | 1 | 0 | 1 | 1 | 0 DEGREES | 180 DEGREES |

FIG. 24

| | TERM | a1 | a2 | a3 | a4 | a5 | a6 | a7 | a8 | ADOPTED EDGE |
|---|---|---|---|---|---|---|---|---|---|---|
| | 1 | 0 | 0 | 0 | 0 | 0 | 0 | 0 | 0 | 180 DEGREES |
| (1) | 2 | 0 | 0 | 0 | 0 | 0 | 0 | 0 | 1 | 180 DEGREES |
| (2) | 3 | 0 | 0 | 0 | 0 | 0 | 0 | 1 | 1 | 0 DEGREES |
| (3) | 4 | 0 | 0 | 0 | 0 | 0 | 1 | 1 | 1 | 0 DEGREES |
| (4) | 5 | 0 | 0 | 0 | 0 | 1 | 1 | 1 | 1 | 0 DEGREES |
| (5) | 6 | 0 | 0 | 0 | 1 | 1 | 1 | 1 | 1 | 0 DEGREES |
| (6) | 7 | 0 | 0 | 1 | 1 | 1 | 1 | 1 | 1 | 180 DEGREES |
| (7) | 8 | 0 | 1 | 1 | 1 | 1 | 1 | 1 | 1 | 180 DEGREES |
| | 9 | 1 | 1 | 1 | 1 | 1 | 1 | 1 | 1 | 180 DEGREES |
| | 10 | 1 | 1 | 1 | 1 | 1 | 1 | 1 | 0 | 180 DEGREES |
| | 11 | 1 | 1 | 1 | 1 | 1 | 1 | 0 | 0 | 0 DEGREES |
| | 12 | 1 | 1 | 1 | 1 | 1 | 0 | 0 | 0 | 0 DEGREES |
| | 13 | 1 | 1 | 1 | 1 | 0 | 0 | 0 | 0 | 0 DEGREES |
| | 14 | 1 | 1 | 1 | 0 | 0 | 0 | 0 | 0 | 0 DEGREES |
| | 15 | 1 | 1 | 0 | 0 | 0 | 0 | 0 | 0 | 180 DEGREES |
| | 16 | 1 | 0 | 0 | 0 | 0 | 0 | 0 | 0 | 180 DEGREES |

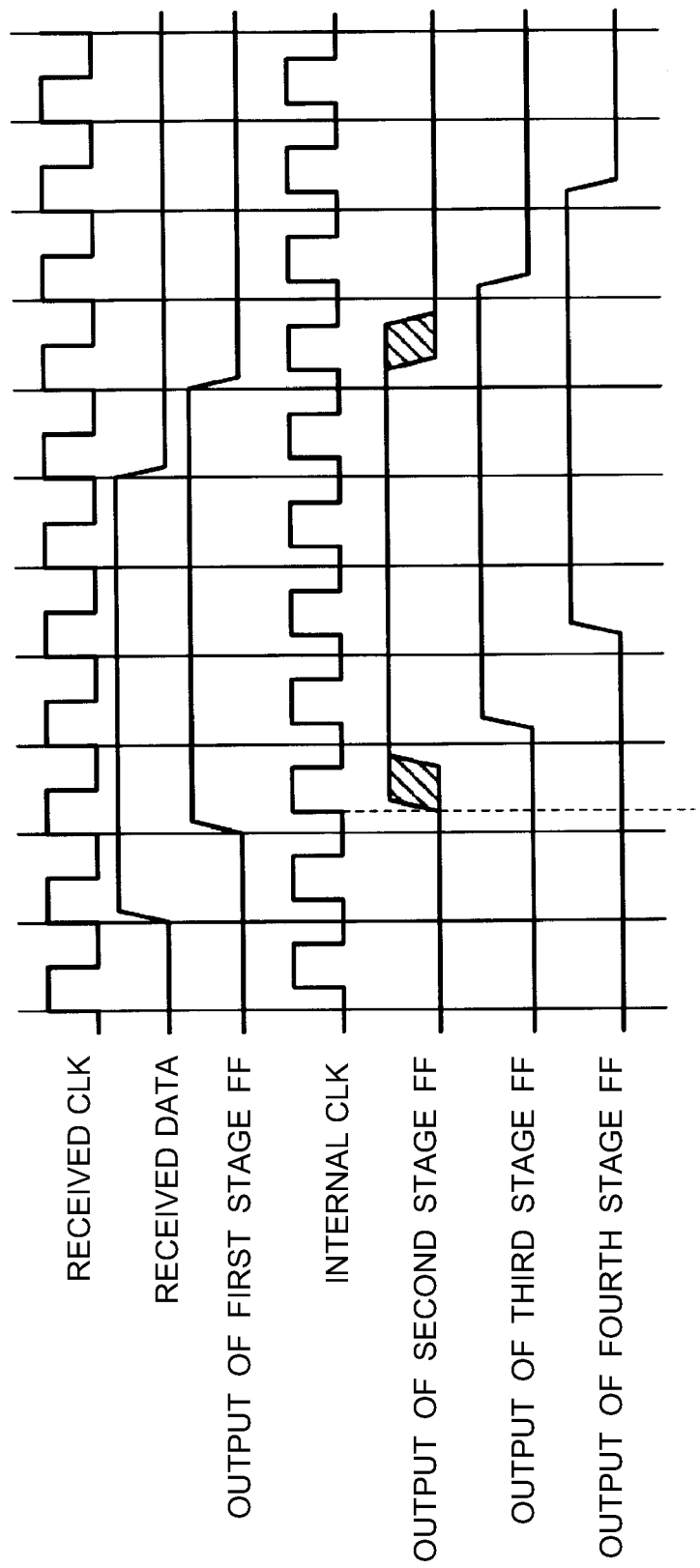

SYNCHRONIZATION CIRCUIT AND SYNCHRONIZATION METHOD

CROSS REFERENCE TO RELATED APPLICATION

This application is based upon and claims the benefit of priority from the prior Japanese Patent Application NO. 2011-116143 filed on May 24, 2011, the entire contents of which are incorporated herein by reference.

FIELD

The embodiments disclosed hereafter are related to a synchronization circuit and a synchronization method.

BACKGROUND

When data is transferred between LSIs (Large Scale Integrations), a phase difference sometimes occurs between the LSI at a transmission side and the LSI at a reception side conventionally even when the frequencies of the clocks are the same.

When a difference occurs to the phases, timing for capturing data with the clock of the LSI at the reception side and a change of the data may take place at the same time. In such a case, metastable occurs, in which the data is brought into an unstable state. Therefore, the LSI at the reception side synchronizes the phase of the received data by using a synchronization circuit having FFs (Flip Flops) of multiple stages.

A synchronization circuit according to a prior art will be described with use of FIGS. 25 and 26. FIG. 25 is a diagram depicting one example of the synchronization circuit according to the prior art. As depicted in FIG. 25, the synchronization circuit according to the prior art has FFs of four stages, for example.

An FF of a first stage takes in received data and a received clock, and outputs the data to an FF of a second stage. Subsequently, the FF of the second stage takes in the data outputted by the FF of the first stage and an internal clock, and outputs the data to an FF of a third stage.

Further, the FF of the third stage takes in the data outputted by the FF of the second stage and the internal clock, and outputs the data to an FF of a fourth stage. Likewise, the FF of the fourth stage takes in the data outputted by the FF of the third stage and the internal clock, and outputs the synchronized data to a combinational circuit, a sequential circuit and the like.

When a phase difference exists between the received clock and the internal clock, the synchronization circuit synchronizes the phase as depicted in FIG. 26. FIG. 26 is a diagram depicting one example of a time chart in the case in which a phase difference exists between the received clock and the internal clock.

As depicted in FIG. 26, when only a small phase difference exists between the time of a change of the data outputted by the FF of the first stage and the time of the rising edge of the internal clock, the FF of the second stage cannot secure a sufficient SETUP time and HOLD time for stably outputting the data. As a result, the FF of the second stage outputs unstable data. Subsequently, the FF of the third stage takes in the unstable data outputted by the FF of the second stage and the internal clock, and outputs the unstable data as stable date. In this manner, the synchronization circuit according to the prior art generally takes stable data in the LSI by fixedly preparing the FFs of multiple stages.

Further, in a TDMA (Time Division Multiple Access) method, an art is also known, which captures the data with the clocks the phases of which are obtained by shifting the phase of the received clock to multiple divided degrees, and selects the clock which captures the data in the middle where the data does not change.

[Patent Document 1] Japanese Laid-Open Patent Publication No. 8-125643

However, the aforementioned prior art has the problem of being unable to synchronize the phase with the reception side clock in a short time.

More specifically, in the prior art, the clock is synchronized each time data is transferred from the LSI at the transmission side to the LSI at the reception side. Synchronization of the clock requires time corresponding to the number of FFs which the synchronization circuit has. As a result, the latency is worsened in the LSI at the reception side. Further, the synchronization circuit in which FFs are serially provided in multiple stages is not suitable for reception of the data which toggles.

Further, in the TDMA method, the phase of the data is not synchronized with the phase of the internal clock at the reception side, but the clock which can capture the received data at stable timing is selected. Therefore, synchronization of the data cannot be performed with the reception side clock.

SUMMARY

According to an aspect of the embodiments, there is provided a synchronization circuit which synchronizes received data, the synchronization circuit including: a determiner configured to determine whether or not data with a phase of a internal clock is able to be stably captured by the synchronization circuit, when the synchronization circuit accepts the data received from another device connected to the synchronization circuit with the phase of the internal clock of the synchronization circuit; a first flip-flop circuit configured to accept the data and the internal clock, to capture the data with the phase of the internal clock and to synchronize the data, when the determiner determines that the synchronization circuit is able to stably capture the data with the phase of the internal clock; and a second flip-flop configured to accept the data and an inverted internal clock that has a phase obtained by inverting the phase of the internal clock, to capture the data with the phase of the inverted internal clock, and to synchronize the data, when the determiner determines that the synchronization circuit is not able to stably capture the data with the phase of the internal clock.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF THE DRAWINGS

FIG. 12 is a diagram depicting examples of output values by the respective shift registers at a time T1 of the time chart depicted in FIG. 11;

FIG. 17 is a diagram depicting an example of a truth table determining whether or not data toggles from a result outputted by each of the shift registers;

FIG. 19 is a diagram depicting an example of a truth table determining the change points of the data from the result outputted by each of the shift registers;

FIG. 23 is a diagram depicting an example of a truth table determining whether or not data toggles from a result outputted by each of shift registers;

FIG. 24 is a diagram depicting an example of a truth table determining change points of the data from the result outputted by each of the shift registers;

FIG. 26 is a diagram depicting an example of a time chart in the case of a phase difference existing between a received clock and an internal clock.

DESCRIPTION OF THE EMBODIMENTS

Hereinafter, embodiments of a synchronization circuit and a synchronization method disclosed by the present application will be described in detail based on the drawings. The invention is not intended to be limited by the embodiments. The respective embodiments can be properly combined within the range without causing a contradiction in the processing contents.

Embodiment 1

In embodiment 1, a configuration example of a reception side LSI (Large Scale Integration) including a synchronization circuit, a configuration of the synchronization circuit, a flow of data in the synchronization circuit, a configuration of a phase difference determination circuit, a procedure of processing, an effect and the like will be described, with use of FIGS. 1 to 21.

[Configuration Example of the Reception Side LSI Including the Synchronization Circuit]

Figure 1:
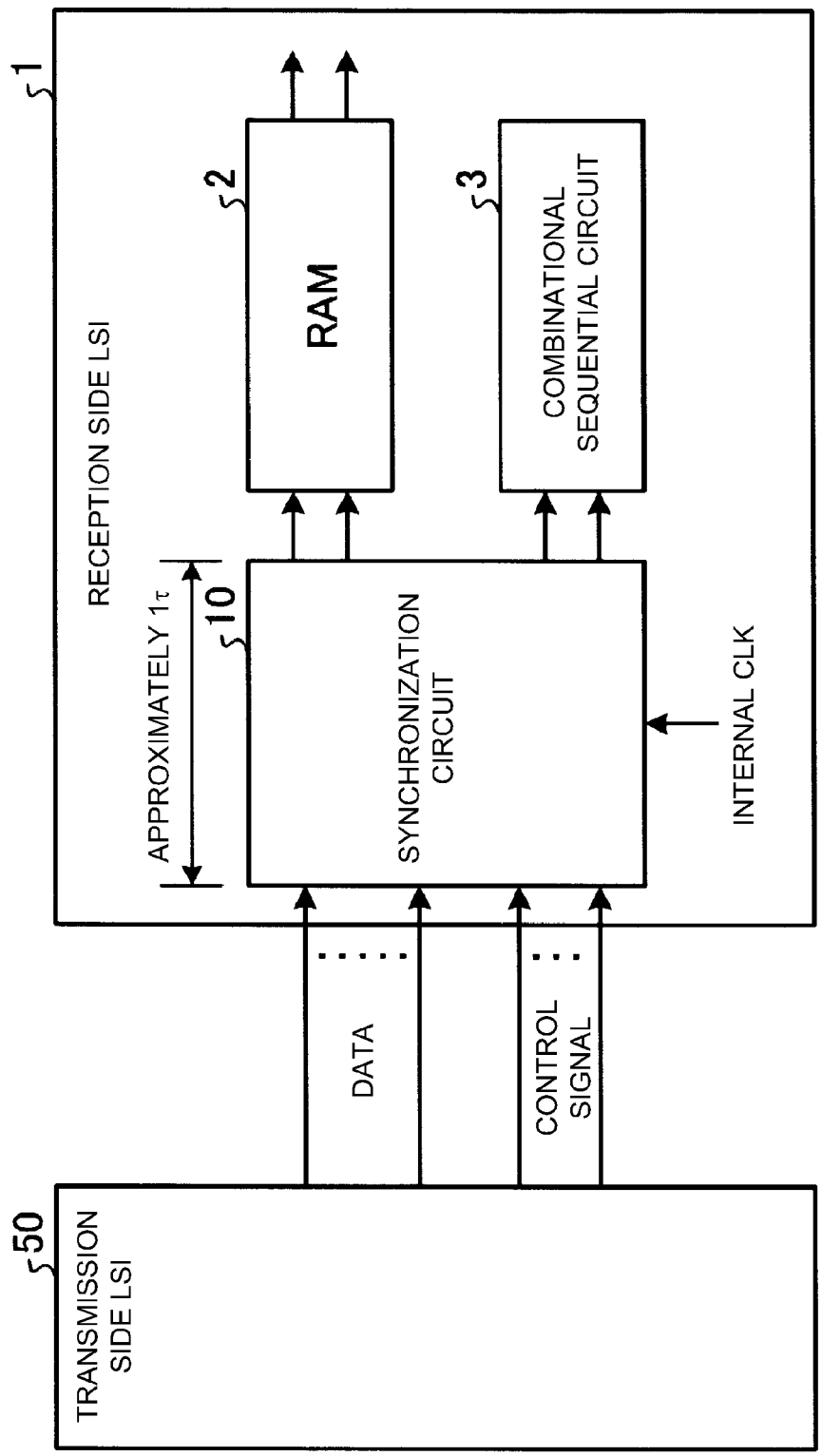
FIG. 1 is a diagram depicting a configuration example of a reception side LSI including a synchronization circuit.

FIG. 1 is a diagram depicting the configuration example of the reception side LSI including the synchronization circuit. As depicted in FIG. 1, a reception side LSI 1 including the synchronization circuit has a synchronization circuit 10, a RAM (Random Access Memory) 2 and a combinational sequential circuit 3.

Further, the reception side LSI 1 is connected to a transmission side LSI 50 with a bus, and receives data and a control signal from the transmission side LSI 50. For example, the data which the reception side LSI 1 receives from the transmission side LSI 50 includes data which toggles.

In the reception side LSI 1, the data which the synchronization circuit 10 receives from the transmission side LSI 50 is synchronized with a phase of an own internal clock in approximately 1 τ. Subsequently, the synchronization circuit 10 outputs the synchronized data to the RAM 2 and the combinational sequential circuit 3. In the following description, the clock will be properly described as CLK (Clock).

[Configuration of the Synchronization Circuit]

Figure 2:
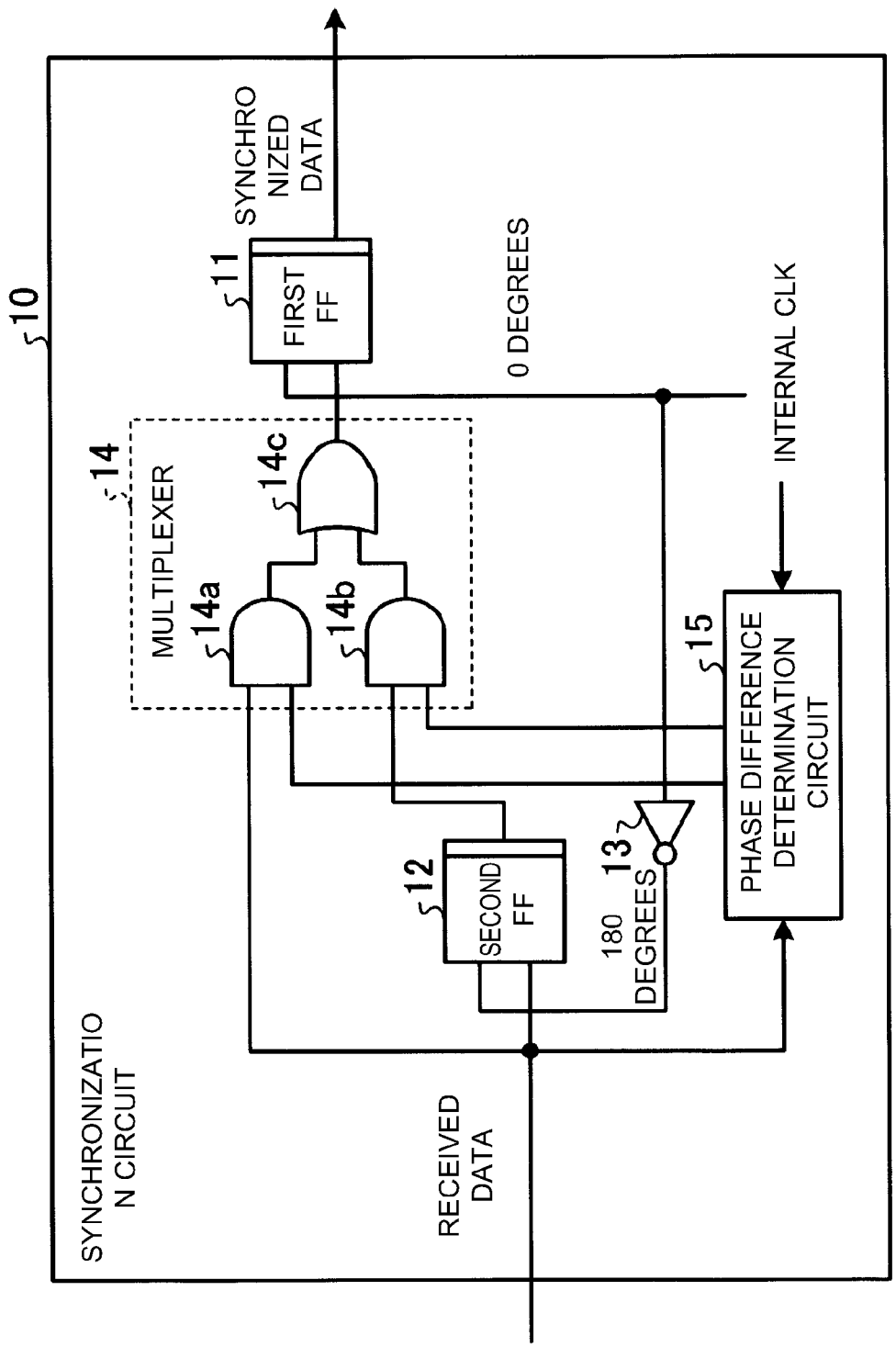
FIG. 2 is a block diagram depicting a configuration of the synchronization circuit.

Next, a configuration of the synchronization circuit 10 depicted in FIG. 1 will be described with use of FIG. 2. FIG. 2 is a block diagram depicting the configuration of the synchronization circuit. As depicted in FIG. 2, the synchronization circuit 10 has a first FF (Flip Flop) 11, a second FF 12, an inverter 13, a multiplexer 14 and a phase difference determination circuit 15.

The first FF 11 accepts the data outputted by the multiplexer 14 and the internal CLK, and captures the data at a rising edge of the internal CLK.

The second FF 12 accepts the data transmitted by the transmission side LSI 50 and the internal CLK the phase of which is inverted by the inverter 13, and captures the data at timing shifted by 180 degrees from the rising edge of the internal CLK.

The inverter 13 accepts the internal CLK, and inverts the phase of the accepted internal CLK and outputs the internal CLK to the second FF 12.

The multiplexer 14 has an AND circuit 14a, an AND circuit 14b and an OR circuit 14c, accepts the data transmitted by the transmission side LSI 50, or the data outputted by the second FF 12, and outputs the accepted data to the first FF 11.

The AND circuit 14a accepts the data transmitted by the transmission side LSI 50 and selection by the phase difference determination circuit 15, and outputs the received data to the OR circuit 14c.

The AND circuit 14b accepts the data outputted by the second FF 12, and selection by the phase difference determination circuit 15, and outputs the accepted data to the OR circuit 14c.

The OR circuit 14c accepts the data outputted by the AND circuit 14a or the AND circuit 14b, and outputs the accepted data to the first FF 11.

The phase difference determination circuit 15 accepts the data transmitted by the transmission side LSI 50 and the internal CLK, and selects the FF of the first stage which stably captures the data from the first FF 11 and the second FF 12 based on the phase difference between the accepted data and the internal CLK.

For example, the phase difference determination circuit 15 determines whether or not a change point of the data transmitted by the transmission side LSI 50 and the rising edge of the internal CLK are close to each other, and selects the FF of the first stage which stably captures the data from the first FF 11 and the second FF 12. Here, the change point of the data indicates timing at which the value of the data changes from "0" to "1" or from "1" to "0".

When the phase difference determination circuit 15 determines that the change point of the data transmitted by the transmission side LSI 50 and the rising edge of the internal CLK are close to each other, the phase difference determination circuit 15 determines that the data cannot be stably captured with the internal CLK. Subsequently, the phase difference determination circuit 15 selects the second FF 12 as the FF of the first stage, in order to invert the phase of the internal CLK and capture the data.

Meanwhile, when the phase difference determination circuit 15 determines that the change point of the data transmitted by the transmission side LSI 50 and the rising edge of the internal CLK are not close to each other, the phase difference determination circuit 15 determines that the data can be stably captured with the internal CLK. Subsequently, the phase difference determination circuit 15 selects the first FF 11 for the FF of the first stage in order to capture the data with the internal CLK.

In this manner, the phase difference determination circuit 15 determines whether or not the data can be stably captured with the phase of the internal CLK, and selects the FF of the first stage suitable for reception of the data in advance. As a result, when the synchronization circuit 10 receives data, the synchronization circuit 10 can synchronize the data with the phase of the internal CLK in a short time.

[Flow of the Data in the Synchronization Circuit]

Next, a flow of the data in the synchronization circuit corresponding to the determination result by the phase difference determination circuit 15 will be described with use of FIGS. 3 to 6.

Figure 3:
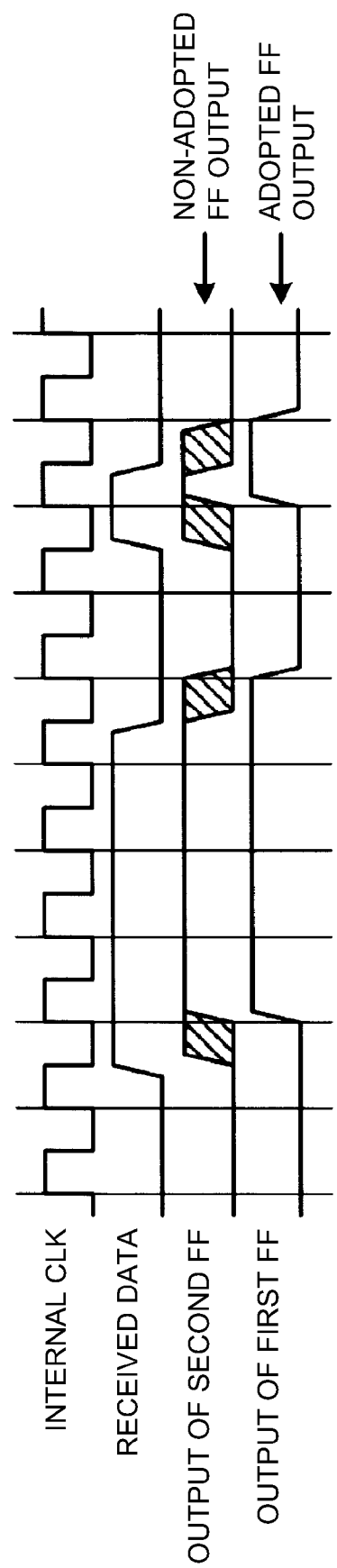
FIG. 3 is a diagram depicting one example of a time chart in the case of a phase difference determination circuit determining to capture data with an internal CLK.

FIG. 3 is a diagram depicting an example of a time chart in the case of the phase difference determination circuit determining to capture data with the internal CLK. As depicted in FIG. 3, the change points of the received data and the rising edges of the internal CLK the phase of which is inverted are close to one another, and therefore, when the second FF 12 captures the data, the second FF 12 outputs unstable data. Meanwhile, the change points of the received data and the rising edges of the internal CLK are far from one another, and therefore, when the first FF 11 captures the data, the first FF 11 outputs stable data.

Figure 4:
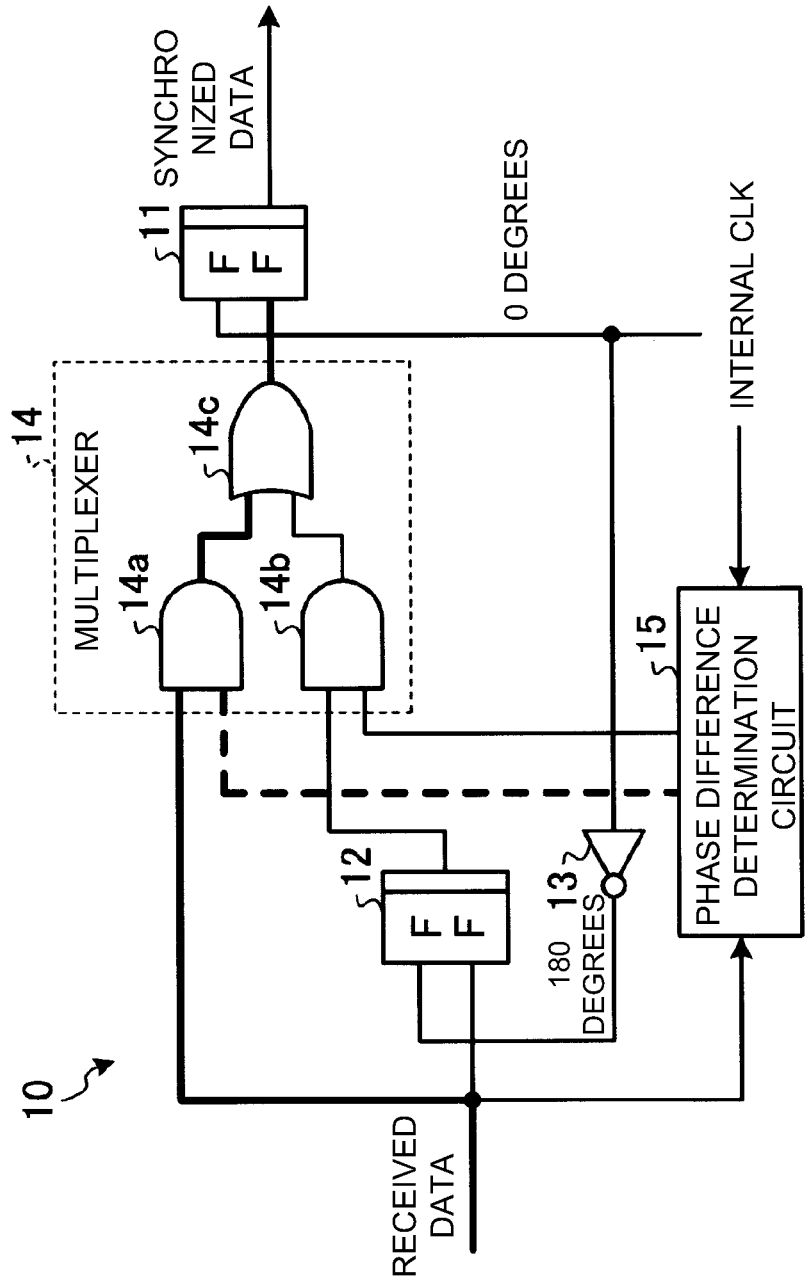
FIG. 4 is a diagram depicting a flow of the data in the case of the phase difference determination circuit determining to capture the data with the internal CLK.

FIG. 4 is a diagram depicting a flow of the data in the case of the phase difference determination circuit determining to capture the data with the internal CLK. When the phase difference determination circuit 15 determines to capture the data with the internal CLK in the synchronization circuit 10 depicted in FIG. 4, the phase difference determination circuit 15 selects the AND circuit 14a.

Subsequently, the AND circuit 14a accepts the data transmitted by the transmission side LSI 50, and outputs the data to the OR circuit 14c. The OR circuit 14c outputs the accepted data to the first FF 11. The first FF 11 accepts the data outputted by the OR circuit 14c and the internal CLK, captures the data with the internal CLK and synchronizes the data with the phase of the internal CLK, and outputs the synchronized data to the combinational sequential circuit 3 and the like.

Figure 5:
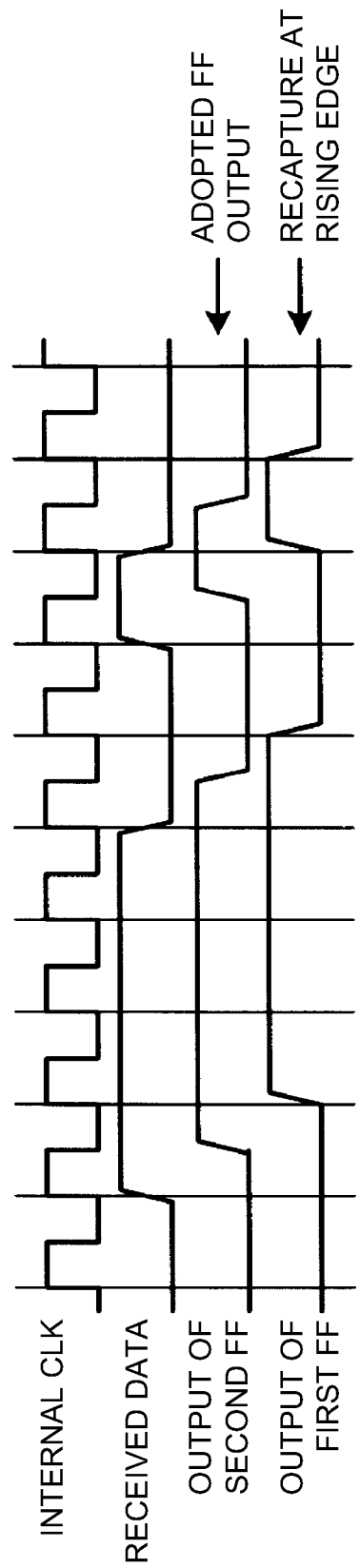
FIG. 5 is a diagram depicting one example of a time chart in the case of the phase difference determination circuit determining to capture the data with the internal CLK a phase of which is inverted.

FIG. 5 is a diagram depicting an example of a time chart in the case of the phase difference determination circuit determining to capture the data with the internal CLK the phase of which is inversed. As depicted in FIG. 5, the change points of the received data and the rising edges of the internal CLK are close to one another. Therefore, when the first FF 11 captures the data, the first FF 11 outputs unstable data not illustrated. Meanwhile, the change points of the received data and the rising edges of the internal CLK the phase of which is inversed are far from one another, and therefore, when the second FF 12 captures the data, the second FF 12 outputs stable data as depicted in FIG. 5. Further, the phase of the data captured by the second FF 12 is inversed with respect to the phase of the internal CLK, and therefore, the data is captured and has the phase returned to be the phase of the internal CLK by the first FF 11, as depicted in FIG. 5.

Figure 6:
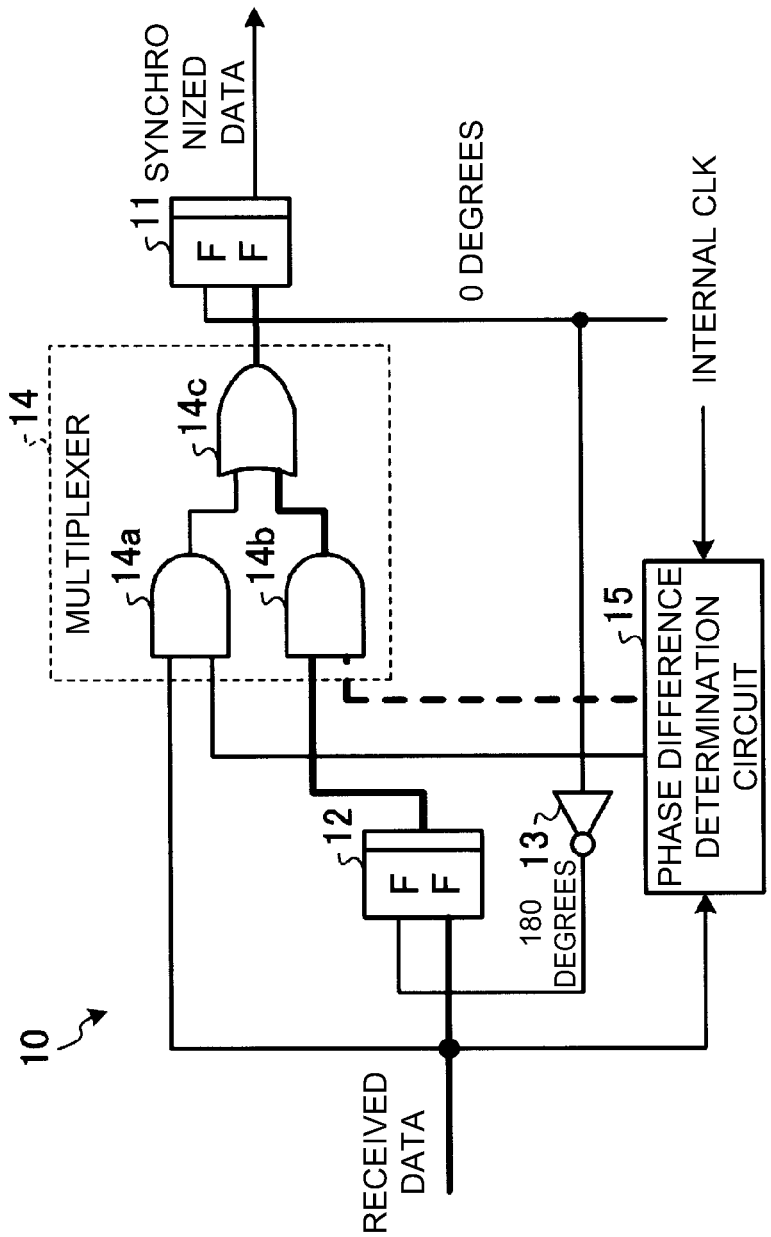
FIG. 6 is a diagram depicting a flow of the data in the case of the phase difference determination circuit determining to capture the data with the internal CLK the phase of which is inverted.

Further, FIG. 6 is a diagram depicting a flow of the data in the case of the phase difference determination circuit determining to capture the data with the internal CLK the phase of which is inverted. When the phase difference determination circuit 15 determines to capture the date with the internal CLK the phase of which is inverted, the phase difference determination circuit 15 selects the AND circuit 14b in the synchronization circuit 10 depicted in FIG. 6.

Further, the second FF 12 accepts the data transmitted by the transmission side LSI 50 and the internal CLK the phase of which is inverted, captures the data with the internal CLK the phase of which is inverted, and outputs the data to the AND circuit 14b.

Subsequently, the AND circuit 14b accepts the data outputted by the second FF 12, and outputs the data to the OR circuit 14c. The OR circuit 14c outputs the accepted data to the first FF 11. The first FF 11 accepts the data outputted by the OR circuit 14c and the internal CLK, captures the data with the internal CLK, synchronizes the data with the phase of the internal CLK, and outputs the synchronized data to the combinational sequential circuit 3 and the like.

[Configuration of the Phase Difference Determination Circuit]

Figure 7:
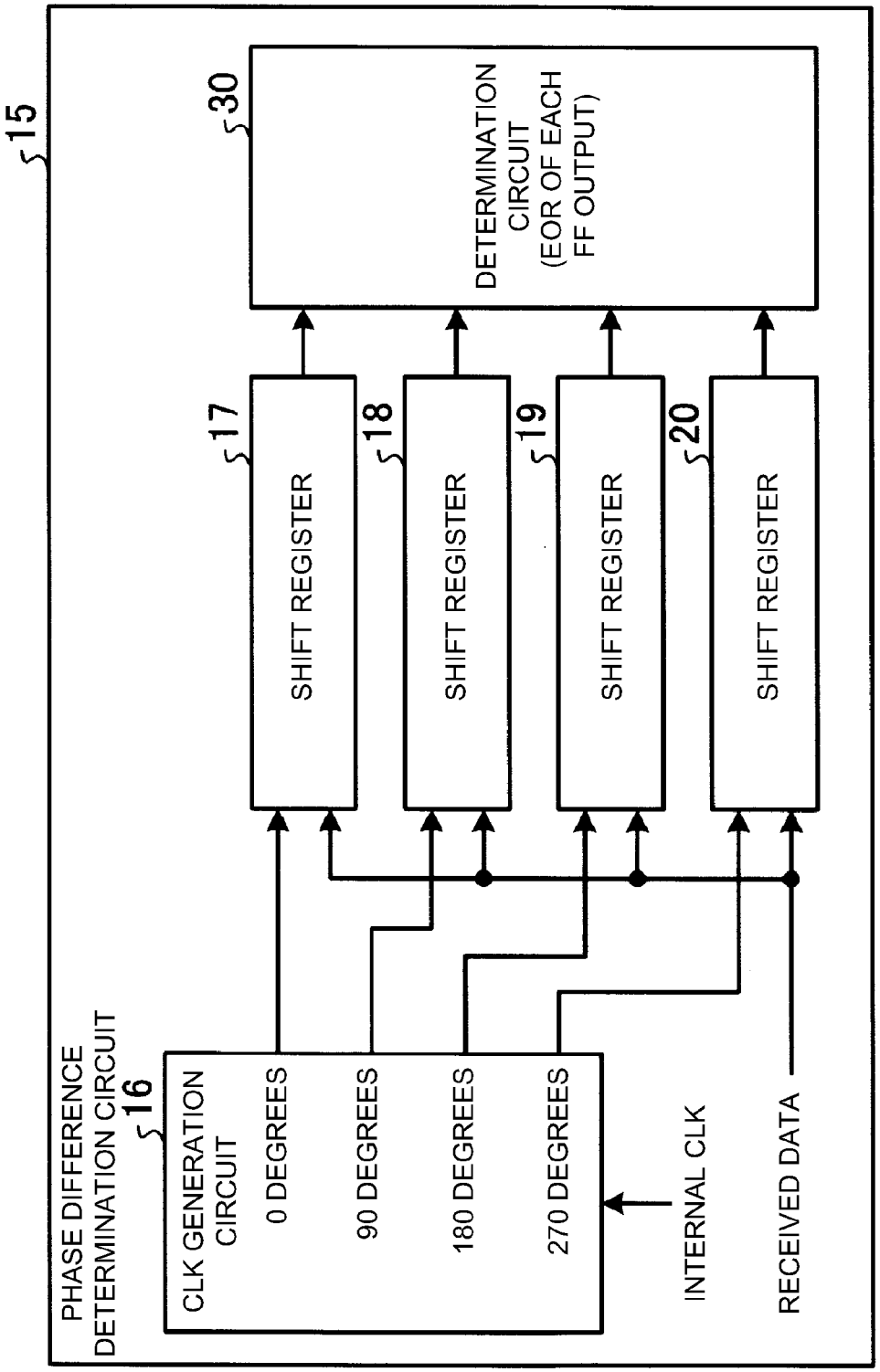
FIG. 7 is a block diagram depicting a configuration of the phase difference determination circuit.

Next, the phase difference determination circuit 15 depicted in FIG. 2 will be described with use of FIG. 7. FIG. 7 is a block diagram depicting a configuration of the phase difference determination circuit. As depicted in FIG. 7, the phase difference determination circuit 15 has a CLK generation circuit 16, shift registers 17 to 20 and a determination circuit 30.

The CLK generation circuit 16 generates CLKs the phases of which are shifted little by little with the internal CLK as a reference, by a DLL (delay-locked loop), a DELAY element and the like. For example, when the internal CLK is set as the reference, the CLK generation circuit 16 generates four CLKs which are a CLK shifted by 0 degrees from the internal CLK, a CLK shifted by 90 degrees from the internal CLK, a CLK shifted by 180 degrees from the internal CLK, and a CLK shifted by 270 degrees from the internal CLK. In the following description, the CLK which is shifted by 0 degrees from the internal CLK will be described as "CLK of 0 degrees", the CLK which is shifted by 90 degrees from the internal CLK will be described as "CLK of 90 degrees". Further, the CLK which is shifted by 180 degrees from the internal CLK will be described as "CLK of 180 degrees", and the CLK which is shifted by 270 degrees from the internal CLK will be described as "CLK of 270 degrees".

Figure 8:
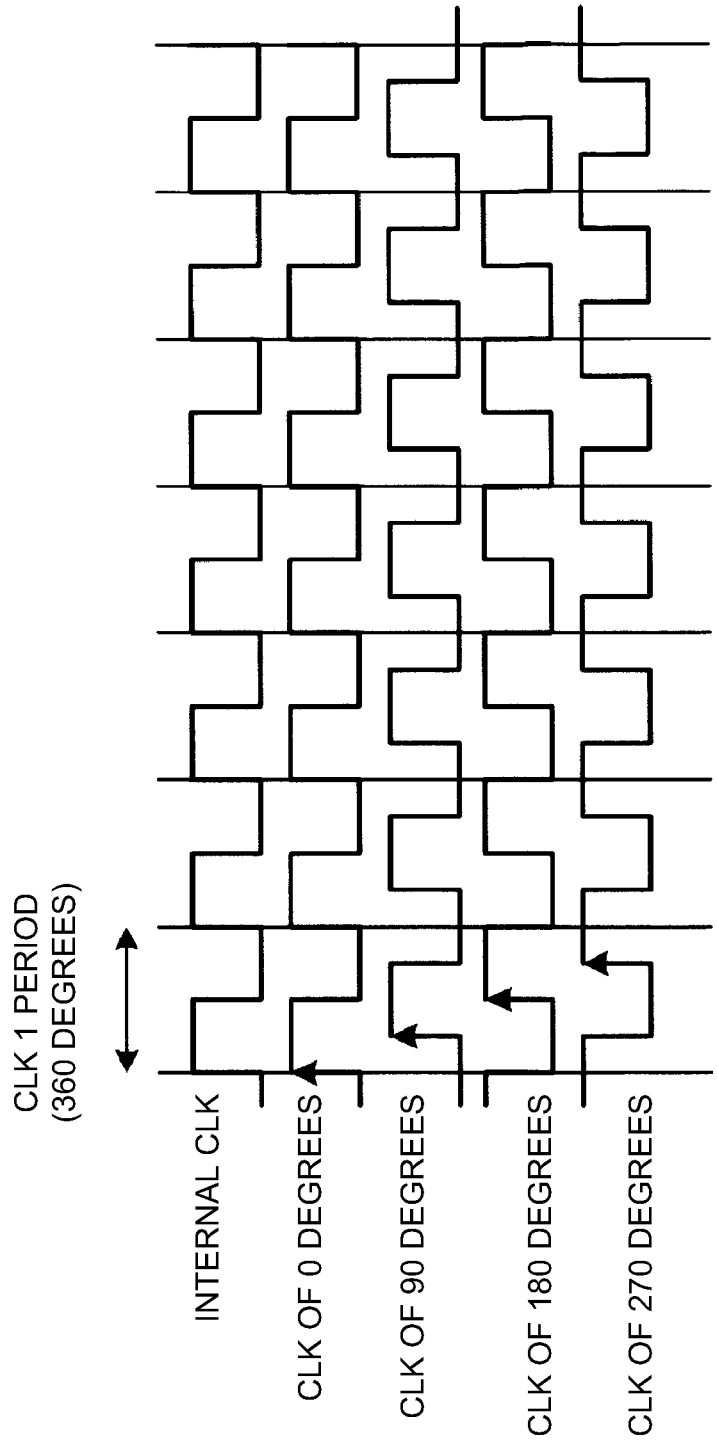
FIG. 8 is a diagram depicting an example of a time chart of CLKs which are generated by a CLK generation circuit.

The CLKs which the CLK generation circuit 16 generates will be described with use of FIG. 8. FIG. 8 is a diagram depicting an example of a time chart of the CLKs which the CLK generation circuit generates. As depicted in FIG. 8, the CLK of 0 degrees which the CLK generation circuit 16 generates rises with the same phase as the internal CLK. The CLK of 90 degrees which the CLK generation circuit 16 generates rises at timing shifted by 90 degrees from the internal CLK. Further, the CLK of 180 degrees which the CLK generation circuit 16 generates is the CLK which has the phase of the internal CLK inverted, and rises at timing shifted by 180 degrees from the internal CLK. The CLK of 270 degrees which the CLK generation circuit 16 generates rises at timing shifted by 270 degrees from the internal CLK.

Returning to FIG. 7, the CLK generation circuit 16 outputs the generated CLKs of the respective phases to the shift registers 17 to 20. For example, the CLK generation circuit 16 outputs the CLK of 0 degrees to the shift register 17, outputs the CLK of 90 degrees to the shift register 18, outputs the CLK of 180 degrees to the shift register 19, and outputs the CLK of 270 degrees to the shift register 20. The number of CLKs which the CLK generation circuit 16 generates can be four or more, and the number of CLKs which are generated can be optionally set.

The shift registers 17 to 20 accept the data and the CLKs of the respective phases, capture the data with the accepted CLKs, and output the results of capturing the data with the respective phases to the determination circuit 30. Here, the number of shift registers which the phase determination circuit 15 has corresponds to the number of CLKs which are generated by the CLK generation circuit 16.

Figure 9:
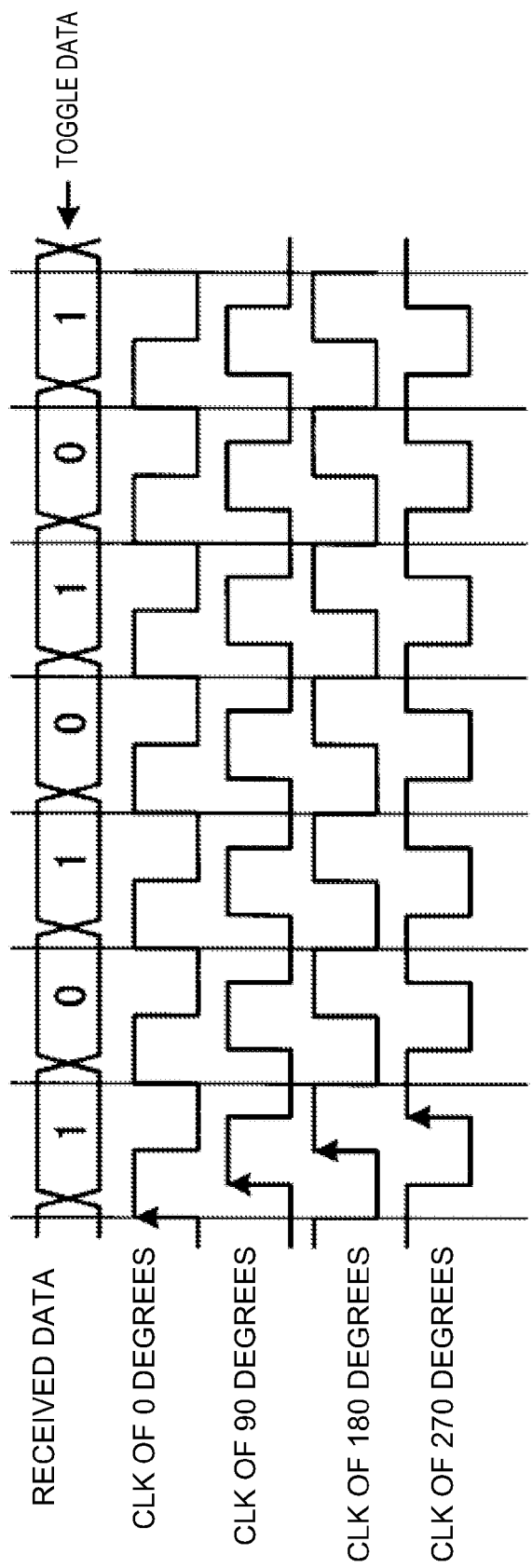
FIG. 9 is a diagram depicting an example of data which is accepted by a shift register and the CLK of each of phases.

The data which the shift registers 17 to 20 accept, and the CLK of each of the phases will be described with use of FIG. 9. FIG. 9 is a diagram depicting examples of the data and the CLKs of the respective phases which the shift registers accept. As depicted in FIG. 9, the data which is transmitted by the transmission side LSI 50 is data the value of which alternately repeats "1" and "0", that is, the data which toggles. The respective shift registers capture the toggling data with the respective phases accepted from the CLK generation circuit 16.

For example, the shift register 17 captures the data at the rising edge of the CLK of 0 degrees, and the shift register 18 captures the data at the rising edge of the CLK of 90 degrees. Further, the shift register 19 captures the data at the rising edge of the CLK of 180 degrees, and the shift register 20 captures the data at the rising edge of the CLK of 270 degrees.

Figure 10:
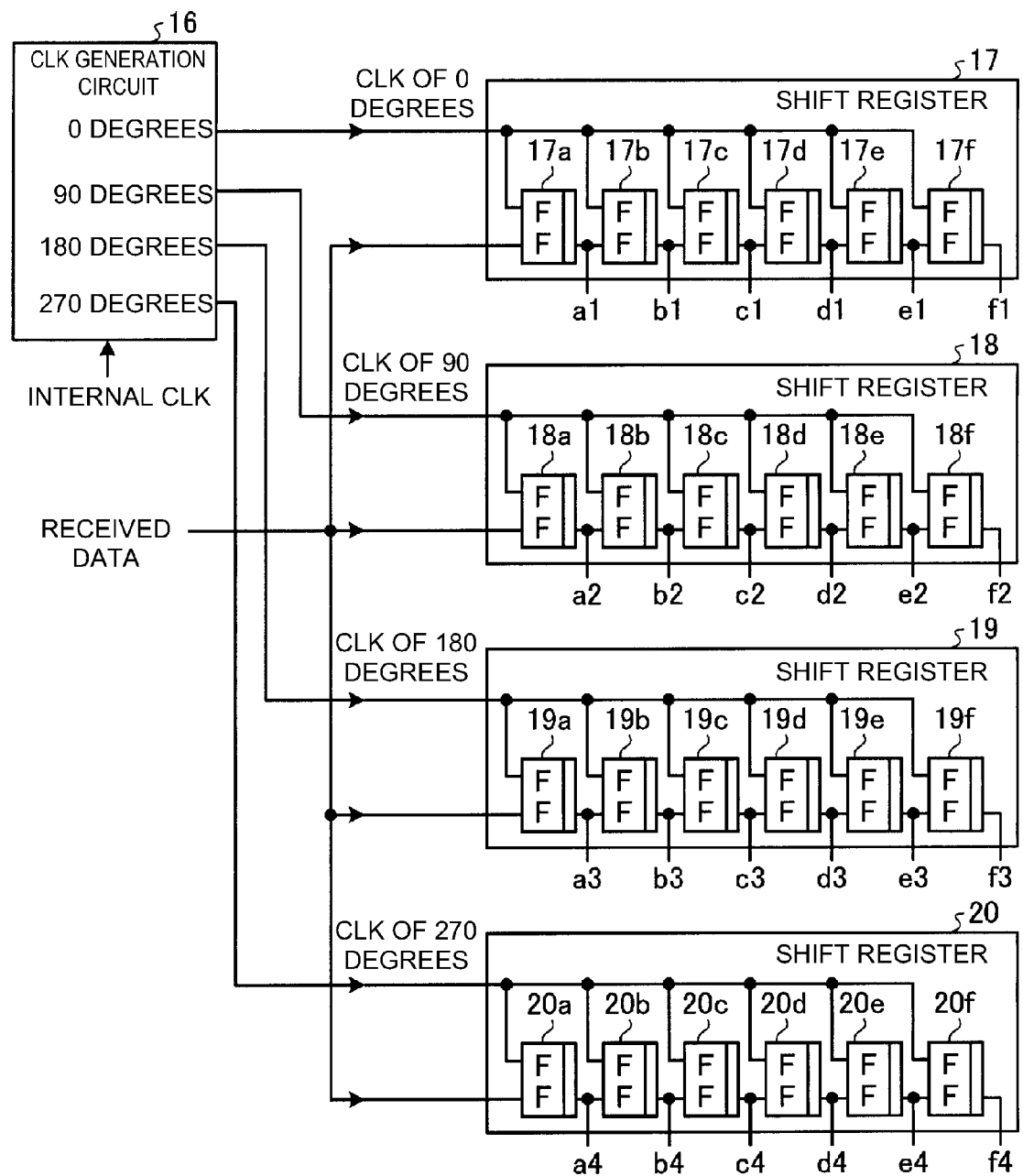
FIG. 10 is a diagram depicting a configuration example of each of shift registers.

Next, configurations of the shift registers 17 to 20 will be described with use of FIG. 10. FIG. 10 is a diagram depicting a configuration example of each of the shift registers. As depicted in FIG. 10, the shift register 17 has FF circuits of six stages that are FF 17a to FF 17f.

The FF 17a which is an FF circuit of the first stage in the shift register 17 accepts the CLK of 0 degrees from the CLK generation circuit 16 and the received data. Subsequently, the FF 17a captures the data received with the CLK of 0 degrees, and outputs captured data a1 to an FF 17b which is an FF circuit of the second stage and the determination circuit 30.

Further, the FF 17b accepts the CLK of 0 degrees from the CLK generation circuit 16 and the data outputted by the FF 17a. Subsequently, the FF 17b captures the data outputted by the FF 17a with the CLK of 0 degrees, and outputs captured data b1 to an FF 17c which is an FF circuit of the third stage and the determination circuit 30.

The FF 17c accepts the CLK of 0 degrees from the CLK generation circuit 16 and the data outputted by the FF 17b. Subsequently, the FF 17c captures the data outputted by the FF 17b with the CLK of 0 degrees, and outputs captured data c1 to an FF 17d which is an FF circuit of the fourth stage and the determination circuit 30.

The FF 17d accepts the CLK of the 0 degrees from the CLK generation circuit 16 and the data outputted by the FF 17c. Subsequently, the FF 17d captures the data outputted by the FF 17c with the CLK of 0 degrees, and outputs captured data d1 to an FF 17e which is an FF circuit of the fifth stage and the determination circuit 30.

The FF 17e accepts the CLK of 0 degrees from the CLK generation circuit 16 and the data outputted by the FF 17d. Subsequently, the FF 17e captures the data outputted by the FF 17d with the CLK of 0 degrees, and outputs captured data e1 to the FF 17f which is an FF circuit of the sixth stage and the determination circuit 30.

The FF 17f accepts the CLK of 0 degrees from the CLK generation circuit 16 and the data outputted by the FF 17e. Subsequently, the FF 17f captures the data outputted by the FF 17e with the CLK of 0 degrees, and outputs captured data f1 to the determination circuit 30.

Further, the configurations of the shift registers 18 to 20 are the same as the configuration of the shift register 17, and therefore, the description thereof will be omitted. The number of FFs which each of the sift registers has is not limited to the above description, and the number of FFs can be optionally changed as long as the number of FFs is six or larger.

Figure 11:
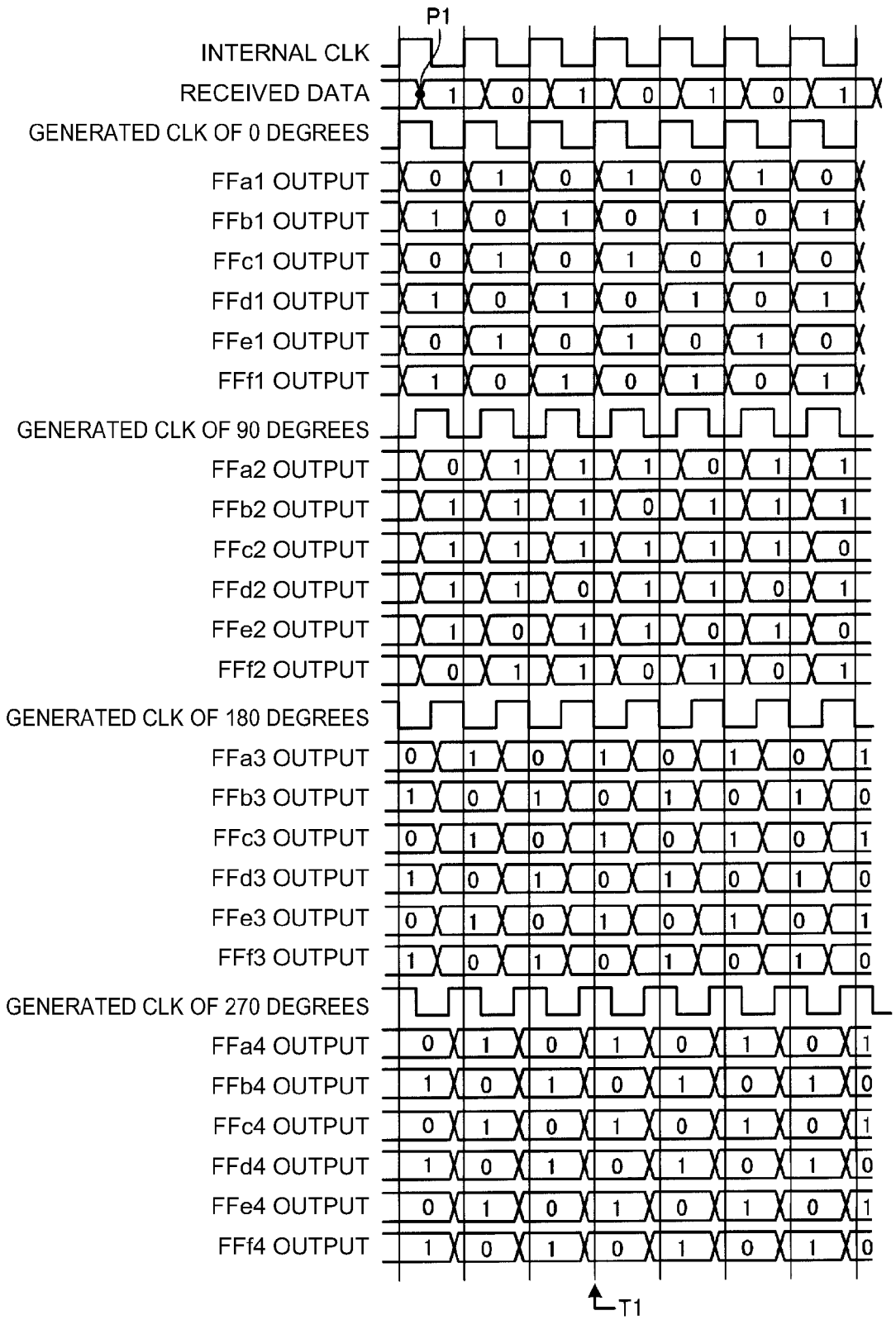
FIG. 11 is a diagram depicting an example of a time chart in the case of change points of the received data being close to rising edges of the generated CLKs.

Examples of outputs by the shift registers 17 to 20 will be described with use of FIGS. 11 and 12. FIG. 11 is a diagram depicting an example of a time chart in the case of the change points of the received data being close to the rising edges of the generated CLKs. As depicted in FIG. 11, a change point P1 of the data received from the transmission side LSI 50 and the rising edge of the CLK of 0 degrees are away from each other. Therefore, the shift register 17 which accepts the CLK of 0 degrees stably captures data, and outputs the data which toggles.

For example, the FF 17a of the first stage of the shift register 17 which accepts the CLK of 0 degrees stably captures data "0" with the CLK of 0 degrees, and outputs "0" as an output a1. Further, the FF 17b of the second stage of the shift register 17 which accepts the CLK of 0 degrees stably captures data "1" with the CLK of 0 degrees, and outputs "1" as an output b1. The FFs of the following stages of the shift register 17, which accept the CLK of 0 degrees stably capture the data with the CLK of 0 degrees and output the data which toggles.

Further, the output value in the shift register 17 which accepts the CLK of 0 degrees at a time T1 of the time chart depicted in FIG. 11 changes as depicted in (1) in FIG. 12. FIG. 12 is a diagram depicting examples of the output values by the respective shift registers at the time T1 of the time chart depicted in FIG. 11. As depicted in (1) in FIG. 12, the shift register 17 which accepts the CLK of 0 degrees outputs the data which toggles in such a manner as "0", "1", "0", "1", "0" and "1".

Further, the rising edge of the CLK of 180 degrees and the rising edge of the CLK of 270 degrees are also away from the change point P1 of the data received from the transmission side LSI 50. Therefore, the shift register 19 which accepts the CLK of 180 degrees and the shift register 20 which accepts the CLK of 270 degrees stably capture data and output the data which toggles similarly to the shift register 17.

Meanwhile, as depicted in FIG. 11, the change point P1 of the data received from the transmission side LSI 50 and the rising edge of the CLK of 90 degrees are close to each other. Therefore, the shift register 18 which accepts the CLK of 90 degrees sometimes cannot capture the data stably, and therefore, cannot output data which toggles.

For example, an FF 18a of the first stage of the shift register 18 which accepts the CLK of 90 degrees stably captures data "0" with the CLK of 90 degrees, and outputs "0" as an output a2. Further, an FF 18b of the second stage of the shift register which accepts the CLK of 90 degrees stably captures data "1" with the CLK of 90 degrees, and outputs "1" as an output b2.

However, an FF 18c of the third stage of the shift register which accepts the CLK of 90 degrees cannot capture the data "0" stably with the CLK of 90 degrees, and outputs "1" as an output c2. In the case like this, the shift register 18 which accepts the CLK of 90 degrees outputs the data which does not toggle and outputs values in such a manner as "1", "1", "1", "0", "1" and "1" as depicted in (2) in FIG. 12.

Figure 13:
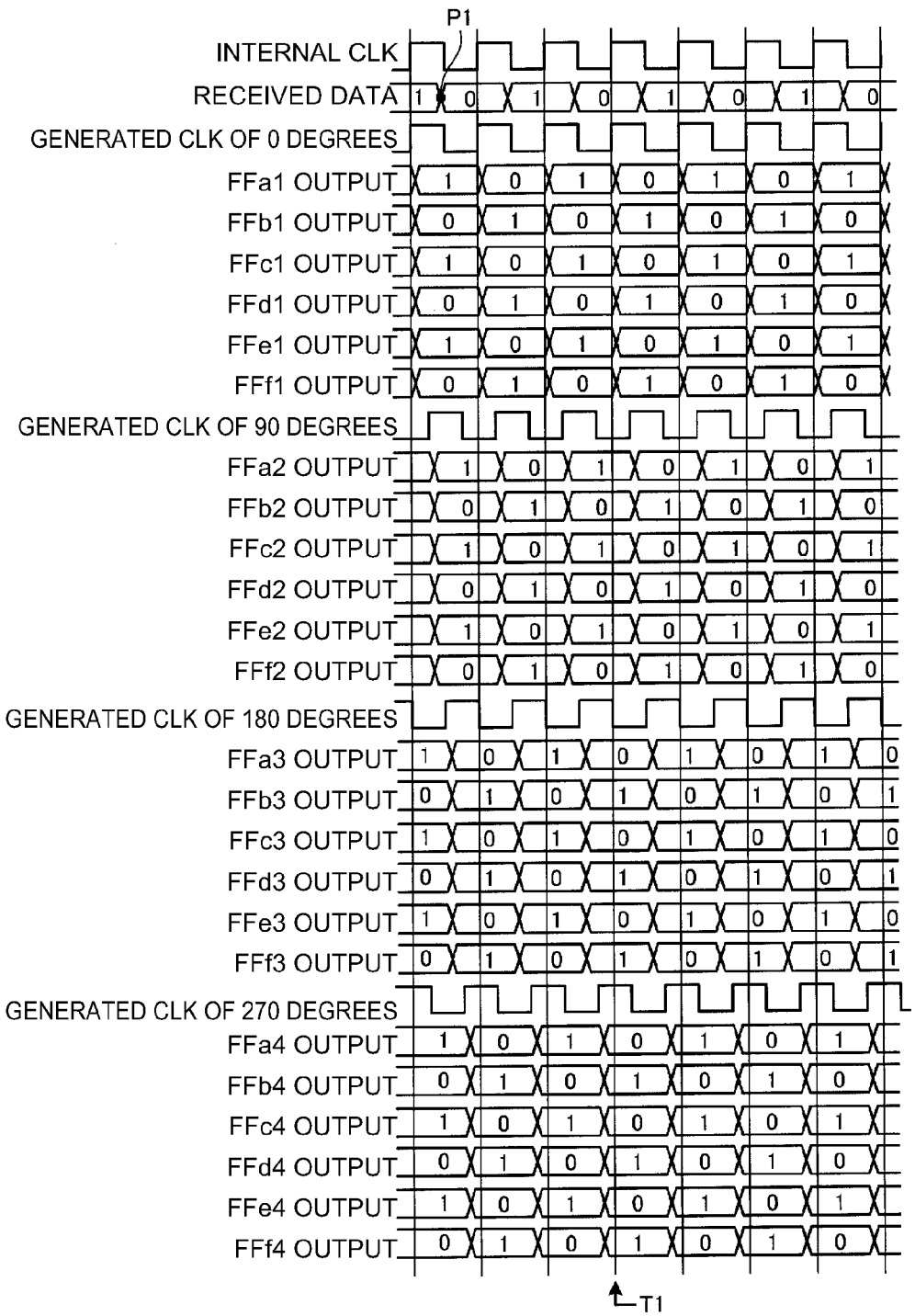
FIG. 13 is a diagram depicting an example of a time chart in the case of the change point of the received data being slightly close to the rising edges of the generated CLKs.

Another example of the output by the shift registers 17 to 20 will be described with use of FIGS. 13 and 14. FIG. 13 is a diagram depicting an example of a time chart in the case of the change points of the received data being slightly close to the rising edges of the generated CLKs. As depicted in FIG. 13, the change point P1 of the data received from the transmission side LSI 50 and the rising edge of the CLK of 0 degrees are away from each other. Therefore, the shift register 17 which accepts the CLK of 0 degrees stably captures the data, and outputs the data which toggles.

Figure 14:
FIG. 14 is a diagram depicting examples of output values of the respective shift registers at a time T1 of the time chart depicted in FIG. 13.

Further, the output value in the shift register 17 which accepts the CLK of 0 degrees at the time T1 of the time chart depicted in FIG. 13 changes as depicted in (1) in FIG. 14. FIG. 14 is a diagram depicting examples of output values by the respective shift registers at the time T1 of the time chart depicted in FIG. 13. As depicted in (1) in FIG. 14, the shift register 17 which accepts the CLK of 0 degrees outputs the data which toggles in such a manner as "1", "0", "1", "0", "1" and "0".

The rising edge of the CLK of 270 degrees is also away from the change point P1 of the data received from the transmission side LSI 50. Therefore, the shift register 20 which accepts the CLK of 270 degrees stably captures the data and outputs the data which toggles similarly to the shift register 17 which accepts the CLK of 0 degrees.

Further, as depicted in FIG. 13, the change point P1 of the data received from the transmission side LSI 50, and the rising edge of the CLK of 90 degrees and the rising edge of the CLK of 180 degrees are slightly close to one another. Therefore, the shift register 18 which accepts the CLK of 90 degrees or the shift register 19 which accepts the CLK of 180 degrees sometimes cannot capture the data stably, but stably captures the data and outputs the data which toggles in the example depicted in FIG. 13.

Returning to FIG. 7, the determination circuit 30 identifies the change point of the received data, and selects the CLK the rising edge of which is far with respect to the identified change point based on the output results by the shift registers 17 to 20.

Figure 15:
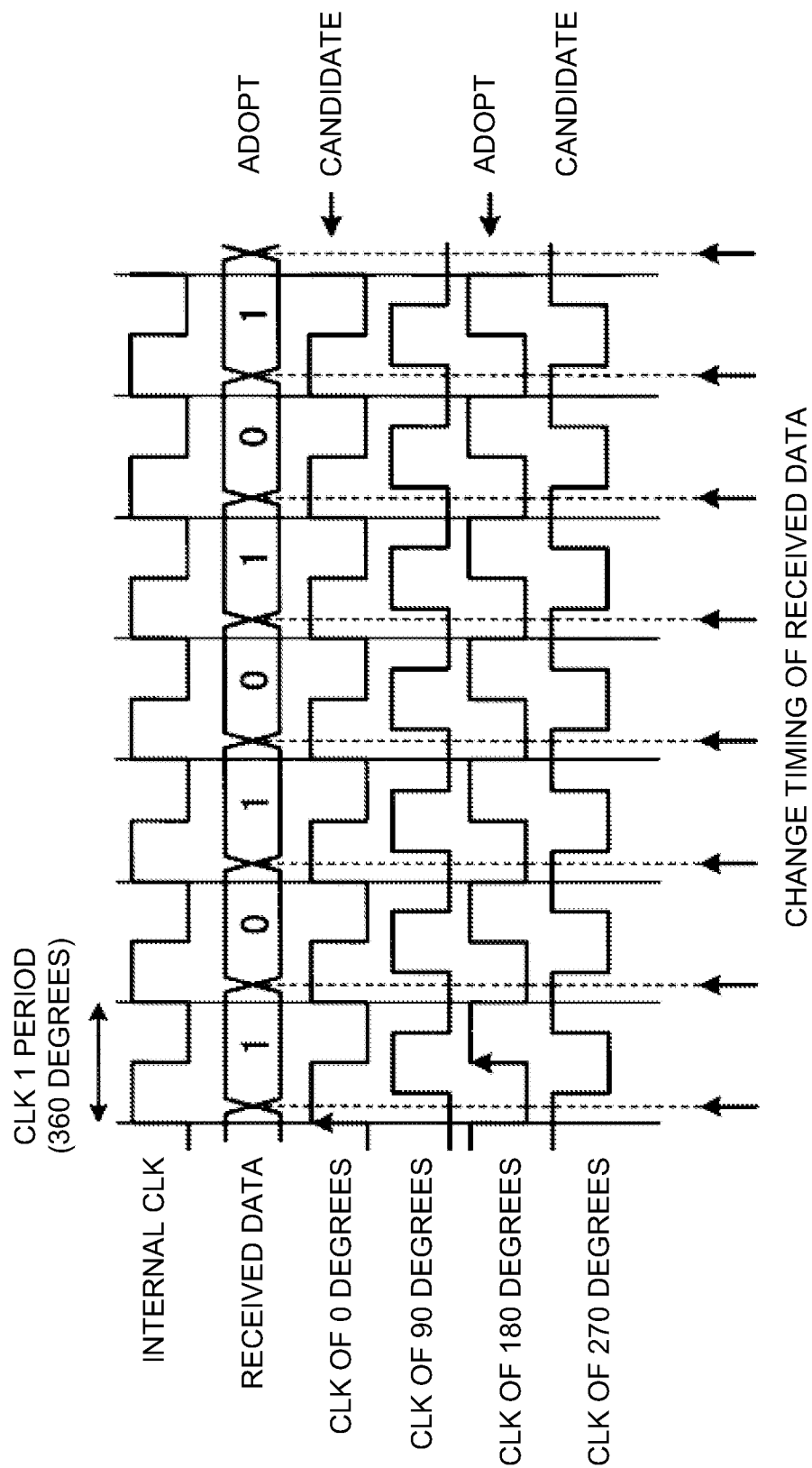
FIG. 15 is a diagram explaining CLKs the rising edges of which are far with respect to the change points of the data.

FIG. 15 is a diagram explaining the CLK the rising edge of which is far with respect to the change point of the data. As depicted in FIG. 15, the change point of the data which is transmitted by the transmission side LSI 50 is set as P1. The determination circuit 30 determines which rising edge is away from the change point P1 of the data, out of the rising edges of CLK of 0 degrees and the CLK of 180 degrees.

In the example depicted in FIG. 15, the rising edge of the CLK of 0 degrees is close to P1, whereas the rising edge of the CLK of 180 degrees is away from P1. In this case, the determination circuit 30 determines that the rising edge of the CLK of 180 degrees is more away from the change point P1 of the data, and selects the CLK of 180 degrees.

Figure 16:
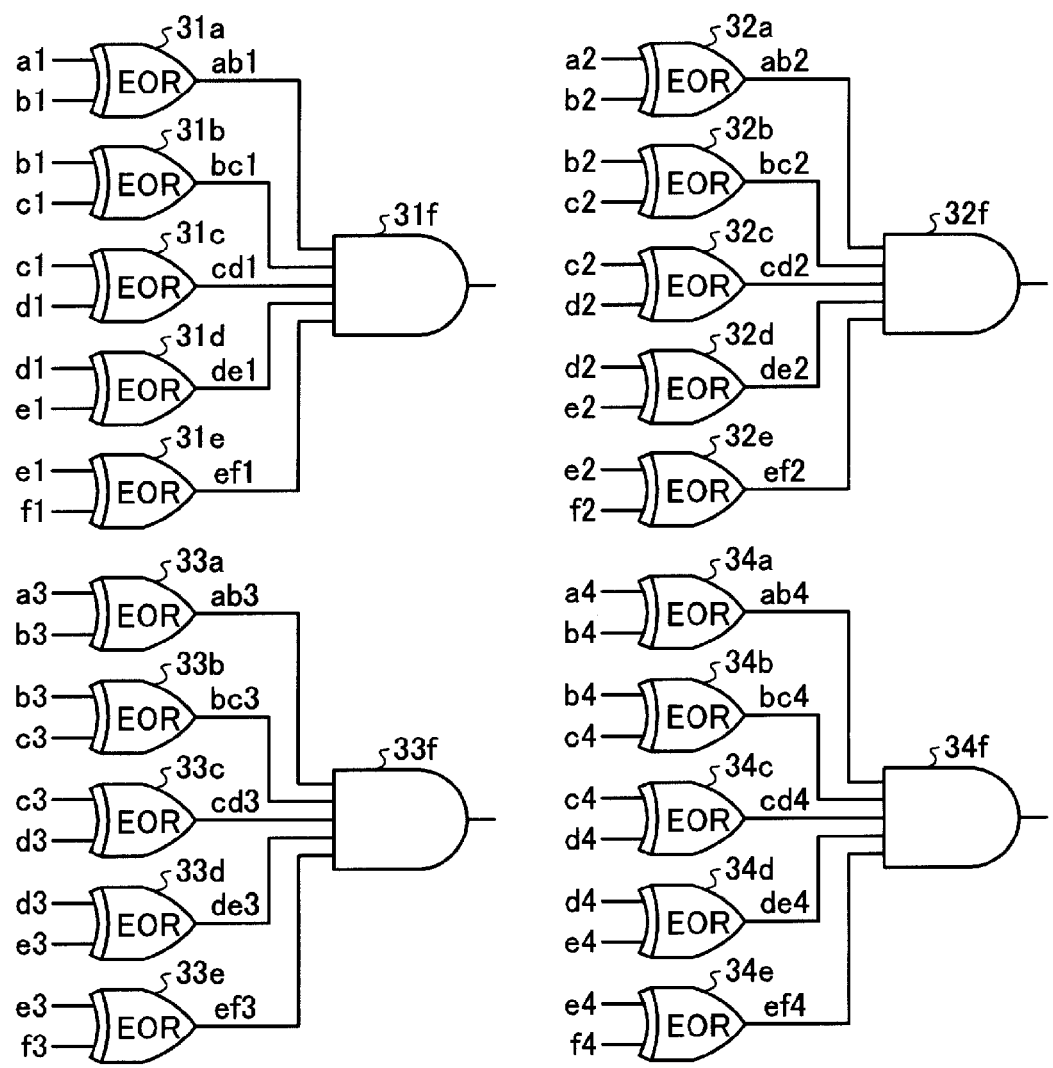
FIG. 16 is a diagram depicting examples of circuits which determine whether or not data is stably outputted, and which a determination circuit has.

An operation of selecting the CLK by the determination circuit will be described with use of FIGS. 16 to 19. FIG. 16 is a diagram depicting examples of circuits which determine whether or not the data is stably outputted. As depicted in FIG. 16, the determination circuit 30 has EOR circuits 31a to 31e, an AND circuit 31f, EOR circuits 32a to 32e, and an AND circuit 32f as the circuits which determine whether or not the data is stably outputted. Further, the determination circuit 30 has EOR circuits 33a to 33e, an AND circuit 33f, EOR circuits 34a to 34e and an AND circuit 34f as the circuits which determine whether or not the data is stably outputted.

The determination circuit 30 compares the output results of the respective stages of the adjacent FFs in each of the shift registers, and determines whether or not the data is stably outputted, as depicted in FIG. 16. Here, when the data is stably captured at the rising edge of each of the CLKs, the data outputted by the adjacent FF toggles. From this, the determination circuit 30 calculates a logical product with respect to exclusive OR of the output results from the respective stages of the adjacent FFs calculated by each of the shift registers, and thereby, determines whether or not the data toggles to determine whether or not the data is stably outputted.

For example, the EOR circuit 31a accepts the results outputted by the FF 17a and the FF 17b of the shift register 17 depicted in FIG. 10, calculates exclusive OR, and outputs the calculated result to the AND circuit 31f. Further, the EOR circuit 31b accepts the result outputted by the FF 17b and the FF 17c of the shift register 17 depicted in FIG. 10, calculates exclusive OR, and outputs the calculated result to the AND circuit 31f.

Further, the EOR circuit 31c accepts the results outputted by the FF 17c and the FF 17d of the shift register 17 depicted in FIG. 10, calculates exclusive OR, and outputs the calculated result to the AND circuit 31f. The EOR circuit 31d accepts the results outputted by the FF 17d and FF 17e of the shift register 17 depicted in FIG. 10, calculates exclusive OR, and outputs the calculated result to the AND circuit 31f.

Further, the EOR circuit 31e accepts the results outputted by the FF 17e and the FF 17f of the shift register 17 depicted in FIG. 10, calculates exclusive OR, and outputs the calculated result to the AND circuit 31f.

Subsequently, the AND circuit 31f accepts the results outputted by the EOR circuits 31a to 31e, and determines whether or not the data toggles, based on the accepted values. Here, when the results outputted by the EOR circuits 31a to 31e are all "1", the AND circuit 31f outputs "1" which indicates that the data is stably outputted and toggles.

FIG. 17 is a diagram depicting an example of a truth table determining whether or not the data toggles from the result outputted by each of the shift registers. The "x" depicted in FIG. 17 indicates that either value of "0" or "1" may be applied.

Further, the case in which "adopted edge" is "y=1" depicted in FIG. 17 indicates the case in which the data is captured with the CLK of 0 degree, and the case in which "adopted edge" is "y=2" indicates the case in which the data is captured with the CLK of 90 degrees. Likewise, the case in which "adopted edge" is "y=3" depicted in FIG. 17 indicates the case in which the data is captured with the CLK of 180 degrees, and the case in which "adopted edge" is "y=4" indicates the case in which the data is captured with the CLK of 270 degrees.

As depicted in FIG. 17, when the values outputted by the FF circuits of each of the stages do not toggle, the determination circuit 30 selects the CLK which is far from an unstable CLK from the CLK of 0 degrees or the CLK of 180 degrees. For example, when the determination circuit 30 determines that the CLK of 90 degrees or the CLK of 180 degrees is unstable, the determination circuit 30 selects the CLK of 0 degrees. Further, when the determination circuit 30 determines that the CLK of 0 degrees or the CLK of 270 degrees is unstable, the determination circuit 30 selects the CLK of 180 degrees.

Figure 18:
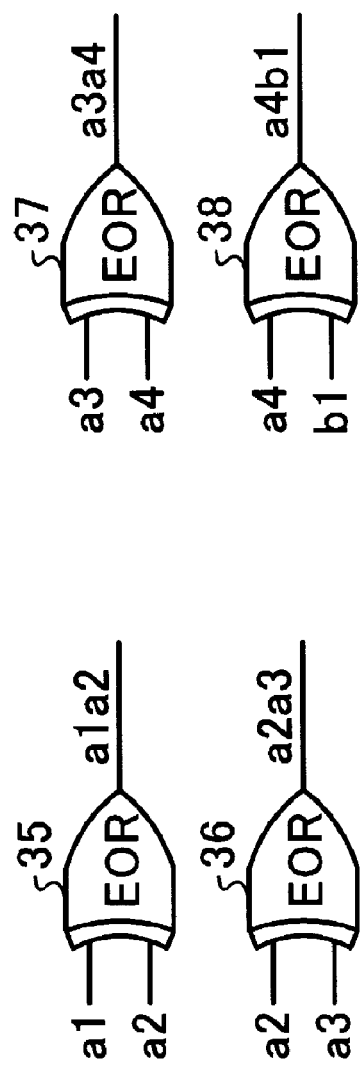
FIG. 18 is a diagram depicting examples of circuits which determines the change point of the data, and which the determination circuit has.

FIG. 18 is a diagram depicting examples of circuits which determine the change point of the data, and which the determination circuit has. As depicted in FIG. 18, the determination circuit 30 has EOR circuits 35 to 38 as the circuits which determine the change point of the data. The determination circuit 30 compares the results outputted by the FF circuits of the same stage of the shift registers with the adjacent CLKS and determines the change point of the data, as depicted in FIG. 18.

For example, the EOR circuit 35 accepts the results outputted by the FF 17a of the shift register 17 and the FF 18a of the shift register 18, calculates exclusive OR, and outputs the calculated result. Further, an EOR circuit 36 accepts the results outputted by the FF 18a of the shift register 18 and an FF 19a of the shift register 19, calculates exclusive OR, and outputs the calculated result.

Likewise, an EOR circuit 37 accepts the results outputted by the FF 19a of the shift register 19 and an FF 20a of the shift register 20, calculates exclusive OR, and outputs the calculated result. Further, the EOR circuit 38 accepts the results outputted by the FF 20a of the shift register 20 and the FF 17b of the shift register 17, calculates exclusive OR, and outputs the calculated result.

Subsequently, the determination circuit 30 determines the change point of the data based on the result outputted by the EOR circuits 35 to 38. Here, for example, when the result outputted by the EOR circuit 35 is "1", the determination circuit 30 determines that the data changes between the CLK of 0 degrees which the shift register 17 accepts, and the CLK of 90 degrees which the shift register 18 accepts.

FIG. 19 is a diagram depicting an example of a truth table determining the change point of the data from the result outputted by each of the shift registers. The value outputted by the FF changes at timing across the change point of the data, and therefore as depicted in FIG. 19, the determination circuit 30 compares the output results from the FFs of the same stage of the shift registers with the adjacent CLKs, and determines the change point of the data. Subsequently, the determination circuit 30 selects the CLK far from the change point of the data, from the CLK of 0 degrees or the CLK of 180 degrees.

For example, when the output value changes between the CLK of 180 degrees and the CLK of 270 degrees as depicted in (1) in FIG. 19, the determination circuit 30 selects the CLK of 0 degrees. Further, when the output value changes between the CLK of 90 degrees and the CLK of 180 degrees as depicted in (2) in FIG. 19, the determination circuit 30 selects the CLK of 0 degrees. Further, when the output value changes between the CLK of 0 degrees and the CLK of 90 degrees as depicted in (3) in FIG. 19, the determination circuit 30 selects the CLK of 180 degrees.

[Procedure of Processing]

Figure 20:
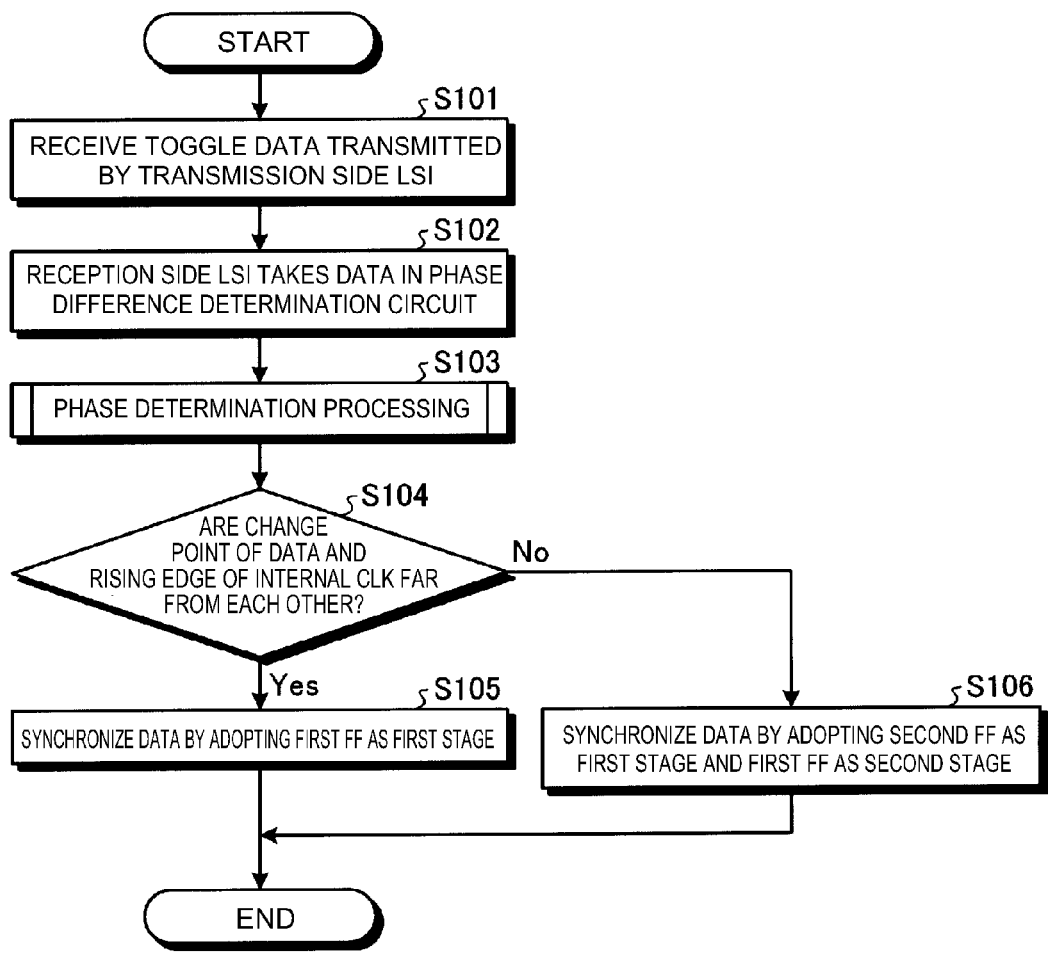
FIG. 20 is a flowchart depicting a processing procedure of synchronization processing by the synchronization circuit.

Next, a procedure of synchronization processing by the synchronization circuit 10 according to embodiment 1 will be described with use of FIG. 20. FIG. 20 is a flowchart depicting the procedure of the synchronization processing by the synchronization circuit. The synchronization circuit 10 executes the processing on reception of the toggle data transferred by the transmission side LSI 50.

As depicted in FIG. 20, the synchronization circuit 10 receives the toggle data transferred by the transmission side LSI 50 (step S101). Subsequently, in the synchronization circuit 10, the phase difference determination circuit 15 accepts the received data (step S102), and executes phase difference determination processing (step S103).

The phase difference determination circuit 15 determines whether or not the change point of the data transmitted by the transmission side LSI 50 and the rising edge of the internal CLK are far from each other (step S104). When the phase difference determination circuit 15 determines that the change point of the data transmitted by the transmission side LSI 50 and the rising edge of the internal CLK are far from each other (step S104, Yes), the synchronization circuit 10 executes the following processing. More specifically, the synchronization circuit 10 synchronizes the data by adopting the first FF 11 as the first stage (step S105).

Meanwhile, when the phase difference determination circuit 15 determines that the change point of the data transmitted by the transmission side LSI 50 and the rising edge of the internal CLK are not far from each other (step S104, No), the synchronization circuit 10 executes the following processing. More specifically, the synchronization circuit 10 synchronizes the data by adopting the second FF 12 as the first stage and the first FF 11 as the second stage (step S106).

Figure 21:
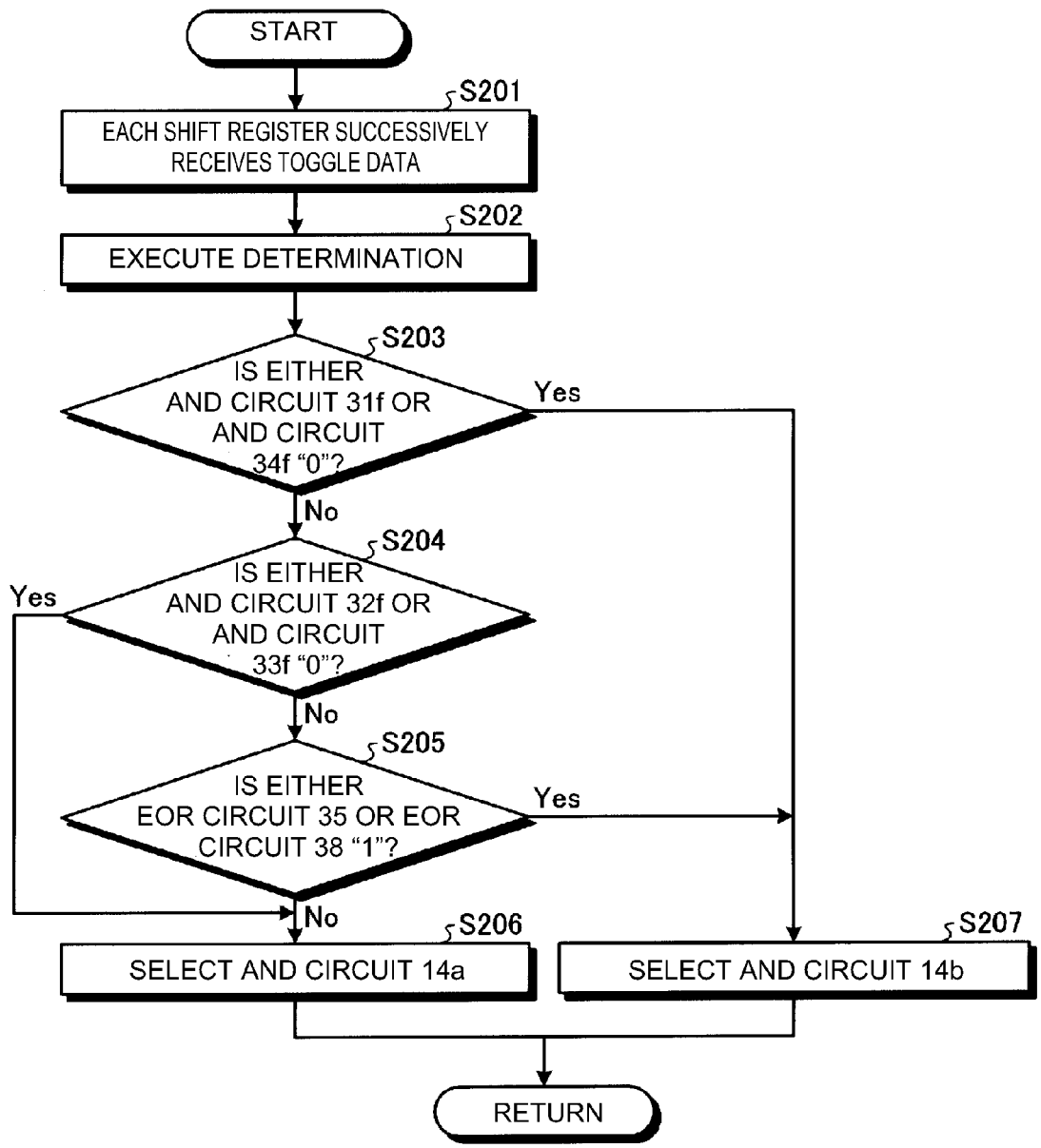
FIG. 21 is a flow chart depicting a processing procedure of phase difference determination processing by the phase difference determination circuit.

Next, the procedure of the phase difference determination processing by the phase difference determination circuit 15 will be described with use of FIG. 21. FIG. 21 is a flowchart depicting the procedure of the phase difference determination processing by the phase difference determination circuit. The processing corresponds to the processing of step S103 depicted in FIG. 20.

As depicted in FIG. 21, in the phase difference determination circuit 15, each of the shift registers successively receives toggle data (step S201). Subsequently, when the shift registers receives the toggling data of 6 τ or more in the phase difference determination circuit 15, the determination circuit 30 executes determination (step S202).

The determination circuit 30 determines whether or not the output result of either the AND circuit 31f or the AND circuit 34f is "0" (step S203). Here, when the determination circuit 30 determines that the output result of either the AND circuit 31f or the AND circuit 34f is "0" (step S203, Yes), the determination circuit 30 determines that it is unstable to capture the data with the internal CLK, and executes the following processing. More specifically, the determination circuit 30 selects the second FF 12 which captures the data with the internal CLK the phase of which is inverted for the first stage, and selects the AND circuit 14b (step S207).

Meanwhile, when the determination circuit 30 determines that neither the output result of the AND circuit 31f nor the output result of the AND circuit 34f is "0" (step S203, No), the determination circuit 30 determines whether or not the output result of either the AND circuit 32f or the AND circuit 33f is "0" (step S204).

Here, when the determination circuit 30 determines that the output result of either the AND circuit 32f or the AND circuit 33f is "0" (step S204, Yes), the determination circuit 30 determines that it is stable to capture the data with the internal CLK, and executes the following processing. More specifically, the determination circuit 30 selects the first FF 11 which captures the data with the internal CLK for the first stage, and selects the AND circuit 14a (step S206).

Meanwhile, when the determination circuit 30 determines that neither the output result of the AND circuit 32f nor the output result of the AND circuit 33f is "0" (step S204, No), the determination circuit 30 determines whether or not the output result of either the EOR circuit 35 or the EOR circuit 38 is "1" (step S205). Here, when the determination circuit 30 determines that the output result of either the EOR circuit 35 or the EOR circuit 38 is "1" (step S205, Yes), the determination circuit 30 determines that the change point of the data is close to the rising edge of the CLK of 0 degrees, and executes the following processing. More specifically, the determination circuit 30 selects the second FF 12 which captures the data with the internal CLK the phase of which is inverted for the first stage, and selects the AND circuit 14b (step S207).

Meanwhile, when the determination circuit 30 determines that neither the output result of the EOR circuit 35 nor the output result of the EOR circuit 38 is "1" (step S205, No), the determination circuit 30 determines that the change point of the data is far from the rising edge of the CLK of 0 degrees, and executes the following processing. More specifically, the determination circuit 30 selects the first FF 11 which captures the data with the internal CLK for the first stage, and selects the AND circuit 14a (step S206). Subsequently, the determination circuit 30 ends the phase difference determination processing after step S206 or S207.

Effect of Embodiment 1

As described above, the synchronization circuit 10 according to embodiment 1 determines whether or not the toggle data is stably captured with the phase of the internal CLK, and selects the FF of the first stage suitable for reception of the toggle data in advance. As a result, when the synchronization circuit 10 receives the toggle data, the synchronization circuit 10 can synchronize the toggle data with the phase of the internal CLK in a short time. In this case, the synchronization circuit 10 can synchronize the data which is received with the phase different from the phase of the internal CLK, within approximately 1 τ.

As a result, the synchronization circuit 10 can improve latency by data transfer. Further, synchronization circuit 10 can apply the internal CLK at the reception side to synchronization, and therefore, can reduce the influence on the RAM 2, the combinational sequential circuit 3 and the like which the LSI on the reception side has.

Embodiment 2

In embodiment 1, the example that the CLK generation circuit 16 generates four kinds of CLKs the phases of which are shifted by 0 degrees, 90 degrees, 180 degrees and 270 degrees with respect to the internal CLK is described. As the number of CLKs which the CLK generation circuit generates becomes larger, determination of the phase difference between the data transmitted by the transmission side LSI 50 and the internal CLK becomes more accurate. Thus, in embodiment 2, the case of generating eight kinds of CLKs in the CLK generation circuit will be described.

[Configuration of the Phase Difference Determination Circuit According to Embodiment 2]

Figure 22:
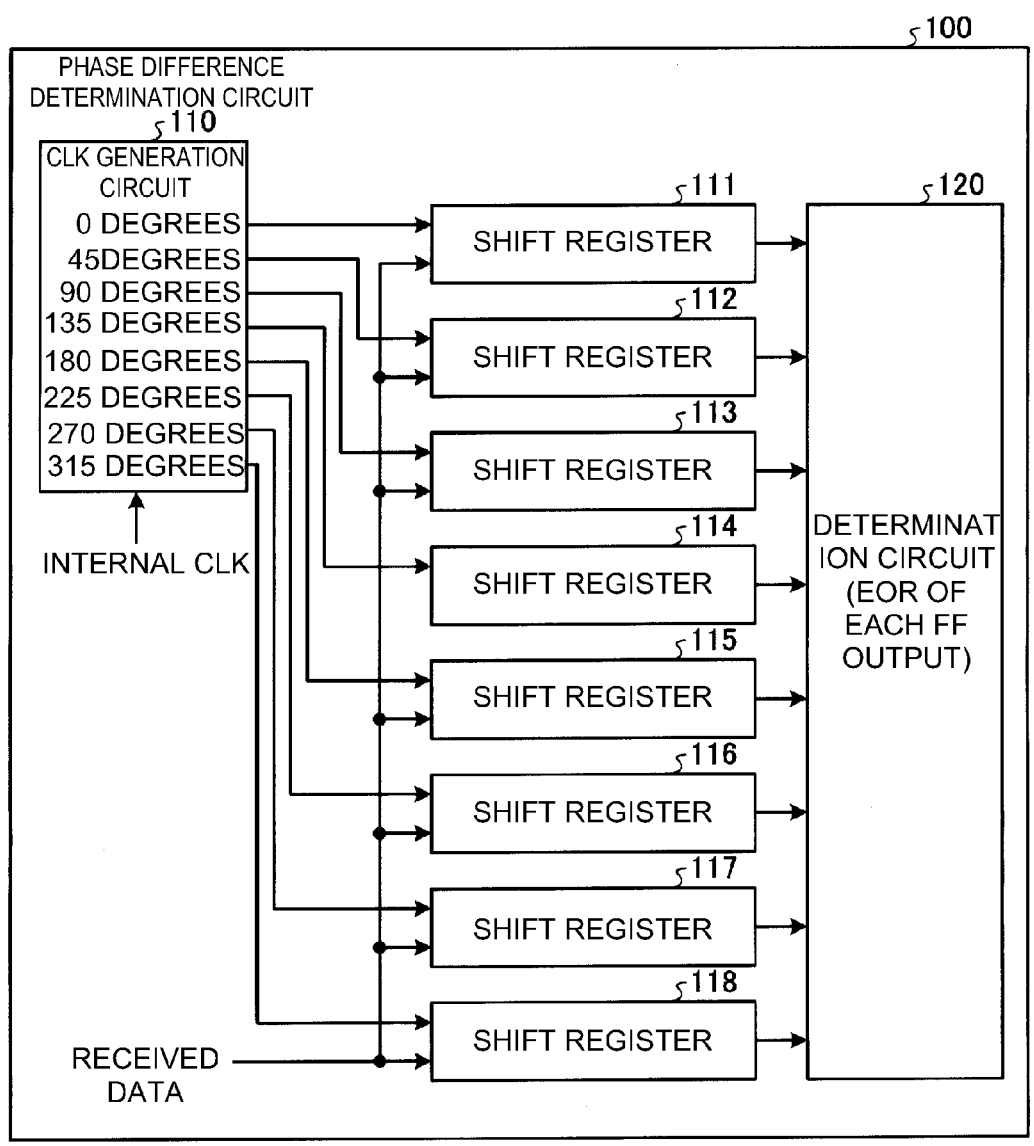
FIG. 22 is a block diagram depicting a configuration of a phase difference determination circuit according to embodiment 2.
Figure 25:
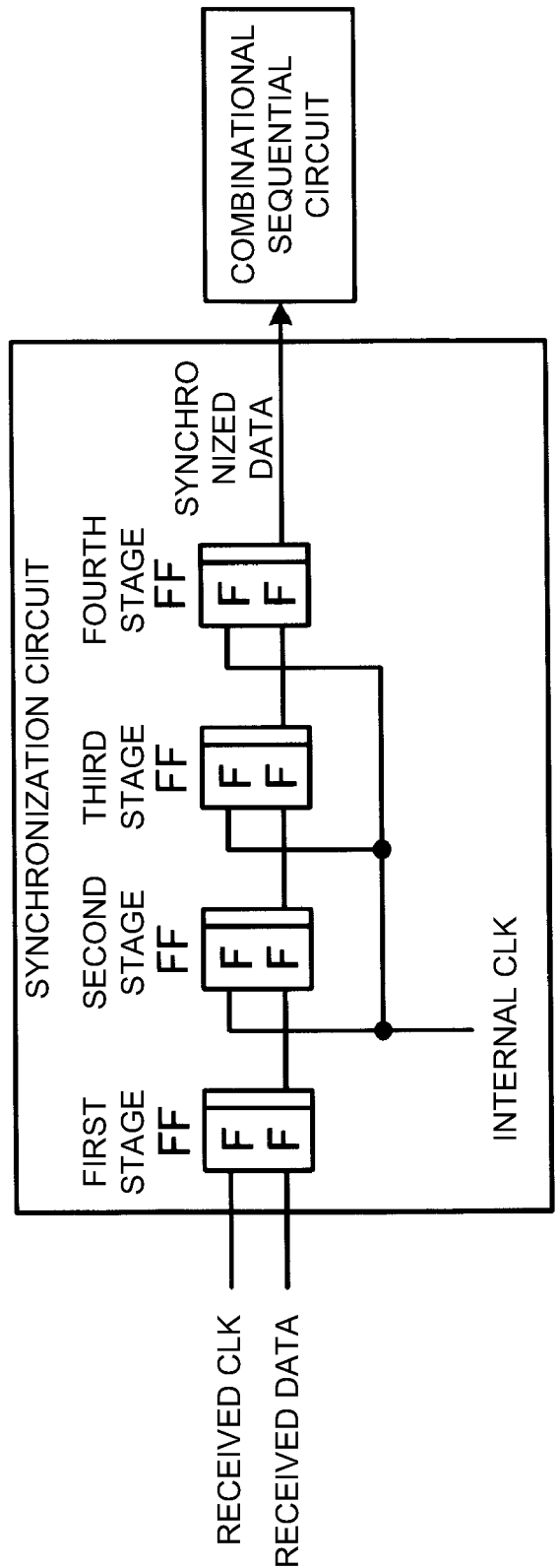
FIG. 25 is a diagram depicting an example of a synchronizing circuit according to a prior art.

Next, a configuration of a phase difference determination circuit according to embodiment 2 will be described with use of FIG. 22. FIG. 22 is a block diagram depicting the configuration of the phase difference determination circuit according to embodiment 2. As depicted in FIG. 22, a phase difference determination circuit 100 according to embodiment 2 has a CLK generation circuit 110, shift registers 111 to 118 and a determination circuit 120.

The CLK generation circuit 110 generates eight CLKs the phases of which are shifted little by little with the internal CLK as a reference, by a DLL (delay-locked loop), a DELAY element and the like. For example, the CLK generation circuit 110 generates a CLK the phase of which is shifted by 0 degrees from the internal CLK, a CLK the phase of which is shifted by 45 degrees from the internal CLK, a CLK the phase of which is shifted by 90 degrees from the internal CLK and a CLK the phase of which is shifted by 135 degrees from the internal CLK when the internal CLK is set as the reference. Further, the CLK generation circuit 110 generates a CLK the phase of which is shifted by 180 degrees from the internal CLK, a CLK the phase of which is shifted by 225 degrees from the internal CLK, a CLK the phase of which is shifted by 270 degrees from the internal CLK, and a CLK the phase of which is shifted by 315 degrees from the internal CLK.

As in embodiment 1, the CLK the phase of which is shifted by 45 degrees from the internal CLK is described as "CLK of 45 degrees", and the CLK the phase of which is shifted by 135 degrees from the internal CLK is described as "CLK of 135 degrees". Further, the CLK the phase of which is shifted by 225 degrees from the internal CLK is described as "CLK of 225 degrees", and the CLK the phase of which is shifted by 315 degrees from the internal CLK is described as "CLK of 315 degrees".

Configurations of the shift registers 111 to 118 are the same as the configurations of the shift registers 17 to 20 according to embodiment 1, and therefore, the detailed description thereof will be omitted.

The determination circuit 120 has the same configuration as the configuration of the determination circuit 30 according to embodiment 1, and therefore, the detailed description thereof will be omitted.

FIG. 23 is a diagram depicting an example of a truth table determining whether or not data toggles from the result outputted by each of the shift registers. The "x" depicted in FIG. 23 indicates that the "x" may be either value of "0" or "1". When the values outputted by the FF circuits of each of the stages do not toggle, the determination circuit 120 selects the CLK which is far from an unstable CLK from the CLK of 0 degrees and the CLK of 180 degrees.

Further, the case in which "adopted edge" is "y=1" depicted in FIG. 23 indicates the case in which the data is captured with the CLK of 0 degrees, and the case in which "adopted edge" is "y=2" indicates the case in which the data is captured with the CLK of 45 degrees. Likewise, the case in which "adopted edge" is "y=3" depicted in FIG. 23 indicates the case in which the data is captured with the CLK of 90 degrees, and the case in which "adopted edge" is "y=4" indicates the case in which the data is captured with the CLK of 135 degrees.

Further, the case in which "adopted edge" is "y=5" depicted in FIG. 23 indicates the case in which the data is captured with the CLK of 180 degrees, and the case in which "adopted edge" is "y=6" indicates the case in which the data is captured with the CLK of 225 degrees. Likewise, the case in which "adopted edge" is "y=7" depicted in FIG. 23 indicates the case in which the data is captured with the CLK of 270 degrees, and the case in which "adopted edge" is "y=8" indicates the case in which the data is captured with the CLK of 315 degrees.

For example, when the determination circuit 120 determines that any one of the CLK of 90 degrees, the CLK of 135 degrees, the CLK of 180 degrees and the CLK of 225 degrees is unstable, the determination circuit 120 selects the CLK of 0 degrees. Further, when the determination circuit 120 determines that any one of the CLK of 0 degrees, the CLK of 45 degrees, the CLK of 270 degrees and the CLK of 315 degrees is unstable, the determination circuit 120 selects the CLK of 180 degrees.

FIG. 24 is a diagram depicting an example of a truth table determining the change point of the data from the result which is outputted by each of the shift registers. The value which is outputted by the FF circuit changes at timing across the change point of the data, and therefore, the determination circuit 120 compares the output results from the FFs at the same stage of the shift registers with the adjacent CLKs, and determines the change point of the data. Subsequently, the determination circuit 120 selects the CLK the rising edge of which is far from the change point of the data, from the CLK of 0 degrees and the CLK of 180 degrees.

For example, as depicted in (1) in FIG. 24, when the output value changes between the CLK of 270 degrees and the CLK of 315 degrees, the determination circuit 120 selects the CLK of 180 degrees. Further, as depicted in (2) in FIG. 24, when the output value changes between the CLK of 225 degrees and the CLK of 270 degrees, the determination circuit 120 selects the CLK of 0 degrees. Further as depicted in (3) in FIG. 24, when the output value changes between the CLK of 180 degrees and the CLK of 225 degrees, the determination circuit 120 selects the CLK of 0 degrees.

Further, as depicted in (4) in FIG. 24, when the output value changes between the CLK of 135 degrees and the CLK of 180 degrees, the determination circuit 120 selects the CLK of 0 degrees. Further, as depicted in (5) in FIG. 24, when the output value changes between the CLK of 90 degrees and the CLK of 135 degrees, the determination circuit 120 selects the CLK of 0 degrees.

Further, as depicted in (6) in FIG. 24, when the output value changes between the CLK of 45 degrees and the CLK of 90 degrees, the determination circuit 120 selects the CLK of 180 degrees. Further, as depicted in (7) in FIG. 24, when the output value changes between the CLK of 0 degrees and the CLK of 45 degrees, the determination circuit 120 selects the CLK of 180 degrees.

Effect of Embodiment 2

As described above, in embodiment 2, the CLK generation circuit 110 generates eight kinds of CLKs the phases of which are different from one another, and therefore, the CLK the rising edge of which is far from the change point of the data can be determined more accurately.

Embodiment 3

The present invention also may be carried out in various different modes other than the embodiments described above. Thus, in embodiment 3, other embodiments included in the present invention will be described.
(System Configuration and the Like)

All or part of the processing which is described as the processing automatically performed out of each processing described in the present embodiment also can be performed manually. Alternatively, all or part of the processing which is described as being performed manually also can be automatically performed by a known method. Other than this, the processing procedures, the control procedures and the specific names which are depicted in the above described sentences and drawings can be optionally changed unless otherwise indicated.

Further, the sequence of the processing in each step of each process described in each of the embodiments may be changed in accordance with various loads, usage states and the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a depicting of the superiority and inferiority of the invention. Although the embodiments of the present invention have been described in detail, it should be understood that the various changes, substitutions, and alterations could be made hereto without departing from the spirit and scope of the invention.

What is claimed is:

1. A synchronization circuit configured to synchronize received data, the synchronization circuit comprising:
   a determiner configured to determine whether or not data with a phase of internal clock is able to be stably captured by the synchronization circuit, when the synchronization circuit accepts the data received from another device connected to the synchronization circuit with the phase of the internal clock of the synchronization circuit;
   a first flip-flop circuit configured to accept the data and the internal clock, to capture the data with the phase of the internal clock and to synchronize the data, when the determiner determines that the synchronization circuit is able to stably capture the data with the phase of the internal clock; and
   a second flip-flop configured to accept the data and an inverted internal clock that has a phase obtained by inverting the phase of the internal clock, to capture the data with the phase of the inverted internal clock, and to synchronize the data, when the determiner determines that the synchronization circuit is not able to stably capture the data with the phase of the internal clock.

2. The synchronization circuit according to claim 1, wherein the second flip-flop outputs output data with the phase of the inverted internal clock, the output data being generated from the captured data with the phase of the inverted internal clock, and the first flip-flop outputs the data with the phase of the internal clock according to the output data that is output from the second flip-flop.

3. The synchronization circuit according to claim 1, further comprising:
   a selector configured to select one of the data received from another device and the output data that is output from the second flip-flop according to a selection information that is output from the determiner, the selection information represents whether or not the data with the phase of the internal clock is able to be captured by the synchronization circuit.

4. The synchronization circuit according to claim 1, wherein:
   the determiner generates at least four generated clocks from the internal clock, a phase difference between two generated clocks from among the at least four generated clocks is equal to a phase difference between the other two generated clocks from among the at least four generated clocks,
   the determiner inputs at least four of the data to at least four shift-registers,
   each of the at least four of the data has a phase obtained by each of the at least four of the generated clocks, and
   the determiner is configured to determine whether or not each of the at least four of the data with the phase obtained by each of the at least four of the generated clock is able to be stably captured by the synchronization circuit according to an output of the shift-register.

5. The synchronization circuit according to claim 4, wherein:
the determiner obtains first results by calculating an exclusive logical sum between outputs from an adjacent two of the shift-registers from among the at least four shift registers,
the determiner obtains a second result by calculating a logical product of all of the first results, and
if the second result is "0", the determiner concludes that the data with the phase of the internal clock is not able to be stably captured by the synchronization circuit.

6. The synchronization circuit according to claim 4, wherein:
the determiner obtains a third result by calculating an exclusive logical sum between an output from one of the shift-registers with a phase of one of the generated clocks and an output from another one of the shift-registers with another phase of one of the generated clocks, a difference between the phase of one of the generated clocks and the another phase being minimum, and
if the third result is "1", the determiner concludes that the data with the phase of the internal clock is not able to be stably captured by the synchronization circuit.

7. A method of synchronizing received data, using a synchronization circuit, comprising:
determining whether or not data with a phase of an internal clock is able to be stably captured by the synchronization circuit, when the synchronization circuit accepts the data received from another device connected to the synchronization circuit with the phase of the internal clock of the synchronization circuit;
accepting the data and the internal clock, capturing the data with the phase of the internal clock and synchronizing the data by the synchronization circuit, when the synchronization circuit determines that the synchronization circuit is able to stably capture the data with the phase of the internal clock;
accepting the data and an internal clock a phase of which is inverted, capturing the data with the phase of the internal clock the phase of which is inverted, and synchronizing the data by the synchronization circuit, when the synchronization circuit determines that the synchronization circuit is not able to stably capture the data with the phase of the internal clock.

* * * * *